United States Patent
Yoshioka et al.

(10) Patent No.: US 6,480,132 B1
(45) Date of Patent: Nov. 12, 2002

(54) A/D CONVERTER WITH HIGHER SPEED AND ACCURACY AND LOWER POWER CONSUMPTION

(75) Inventors: Masato Yoshioka, Kawasaki (JP); Sanroku Tsukamoto, Dreieich-Buchschlag (DE)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/987,347

(22) Filed: Nov. 14, 2001

(30) Foreign Application Priority Data

Mar. 9, 2001 (JP) ........................... 2001-067049

(51) Int. Cl.⁷ .............................................. H03M 1/12
(52) U.S. Cl. ...................... 341/155; 341/159; 341/161; 341/160; 341/162; 341/172; 341/122
(58) Field of Search ................................ 341/155, 156, 341/118, 144, 161, 159, 157, 122

(56) References Cited

U.S. PATENT DOCUMENTS

| | | | |
|---|---|---|---|
| 5,384,569 A | * | 1/1995 | Komatsu ..................... 341/159 |
| 5,539,406 A | * | 7/1996 | Kouno et al. ................ 341/155 |
| 6,069,579 A | * | 5/2000 | Ito et al. ...................... 341/156 |
| 6,239,733 B1 | * | 5/2001 | Lin .............................. 341/159 |
| 6,281,828 B1 | * | 8/2001 | Kimura et al. .............. 341/155 |

FOREIGN PATENT DOCUMENTS

JP  03157020 A  7/1991

* cited by examiner

*Primary Examiner*—Michael Tokar
*Assistant Examiner*—Lam T Mai
(74) *Attorney, Agent, or Firm*—Arent Fox Kintner Plotkin & Kahn, PLLC

(57) ABSTRACT

An A/D converter comprises: a differential amplifier row for amplifying differential voltages between an analog input voltage and reference voltages; a first sample/hold circuit row for sampling/holding the individual differential voltages amplified; a second sample/hold circuit having a pair of second and third sample/hold circuits connected in parallel to each output of the first sample/hold circuit row, thereby performing alternate sampling; a plurality of comparators for determining whether the individual differential voltages held by the first sample/hold circuit row are positive or negative; and an encoder for outputting digital code corresponding to the outputs of the comparators.

24 Claims, 20 Drawing Sheets

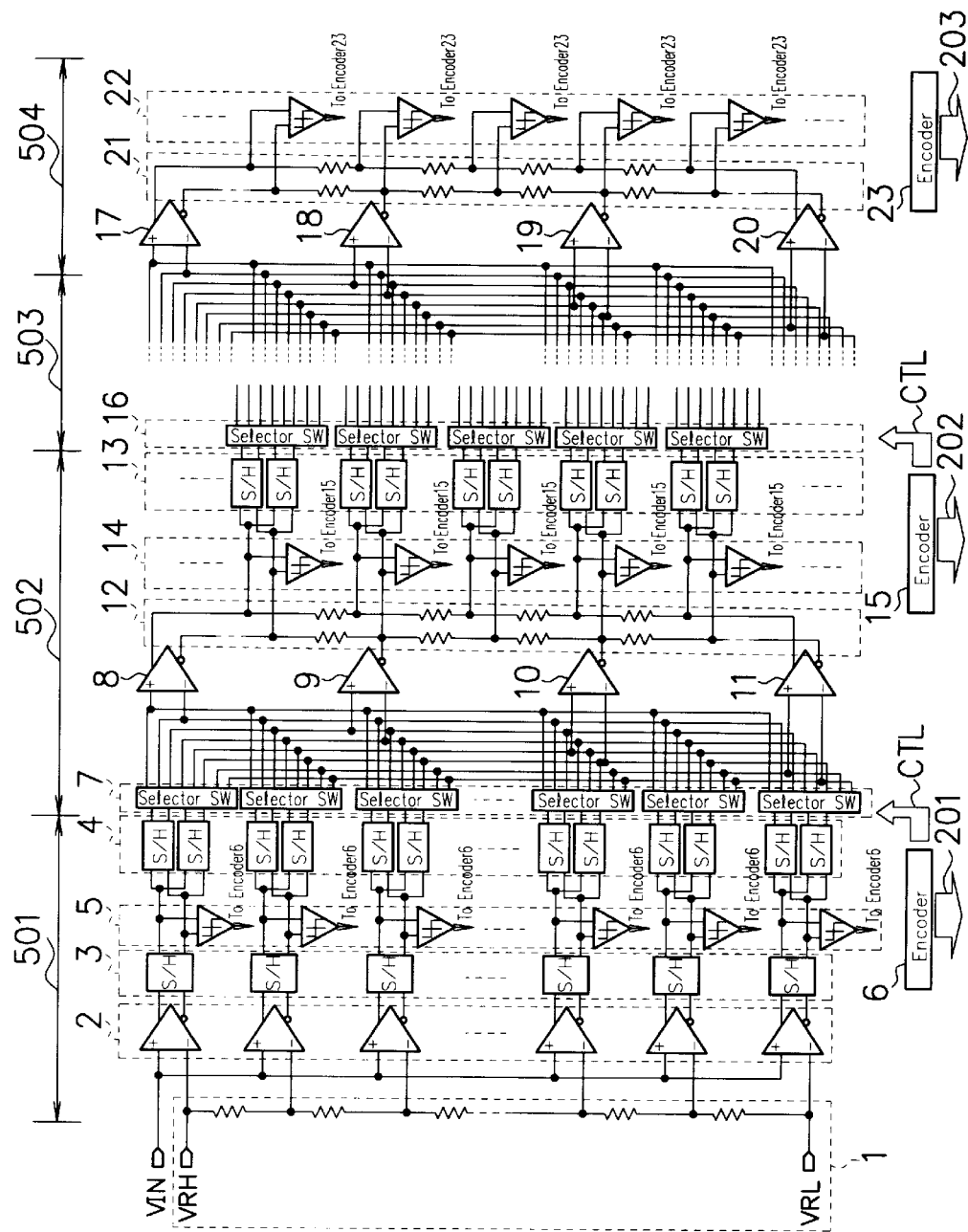
F I G. 5

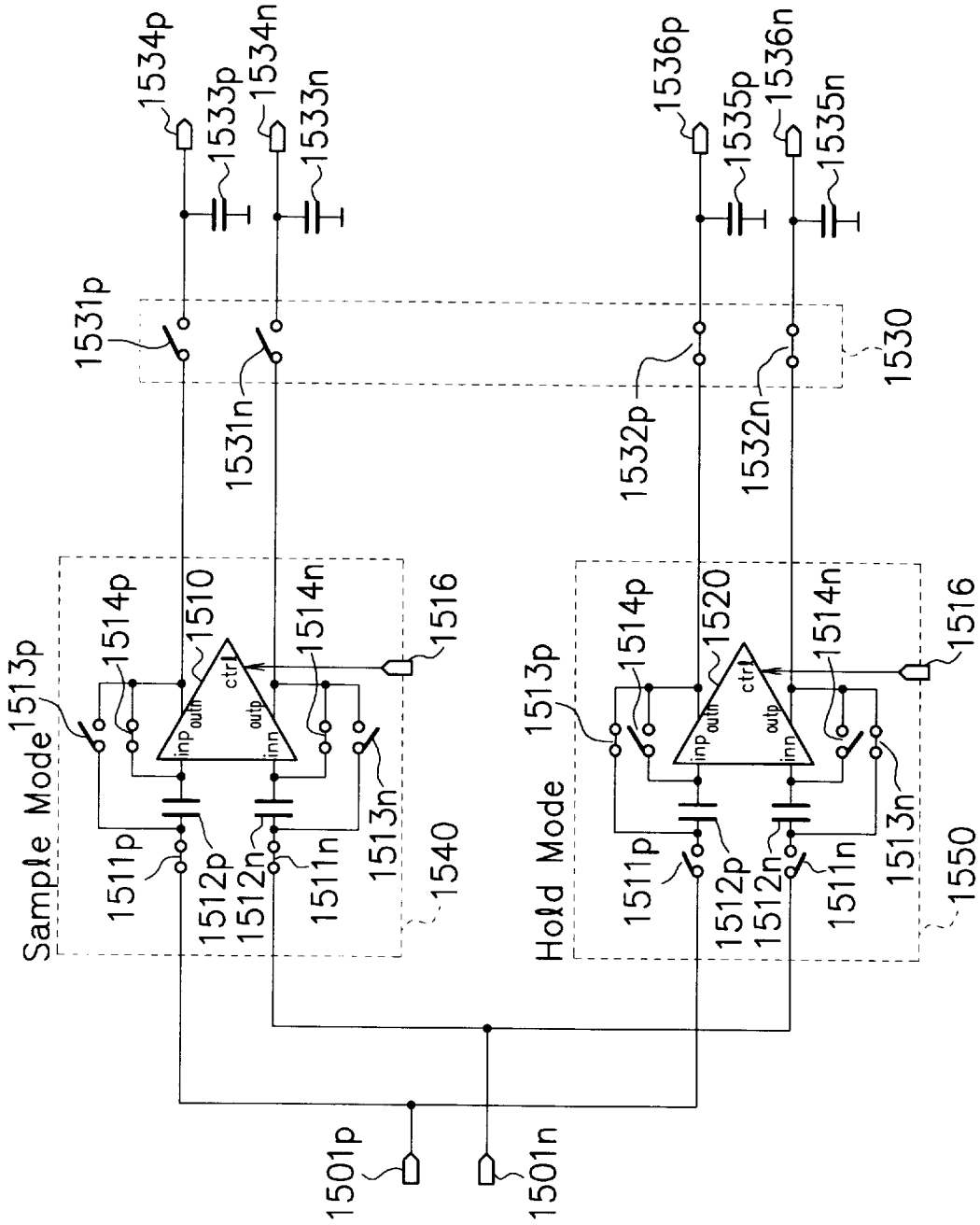
F I G. 15

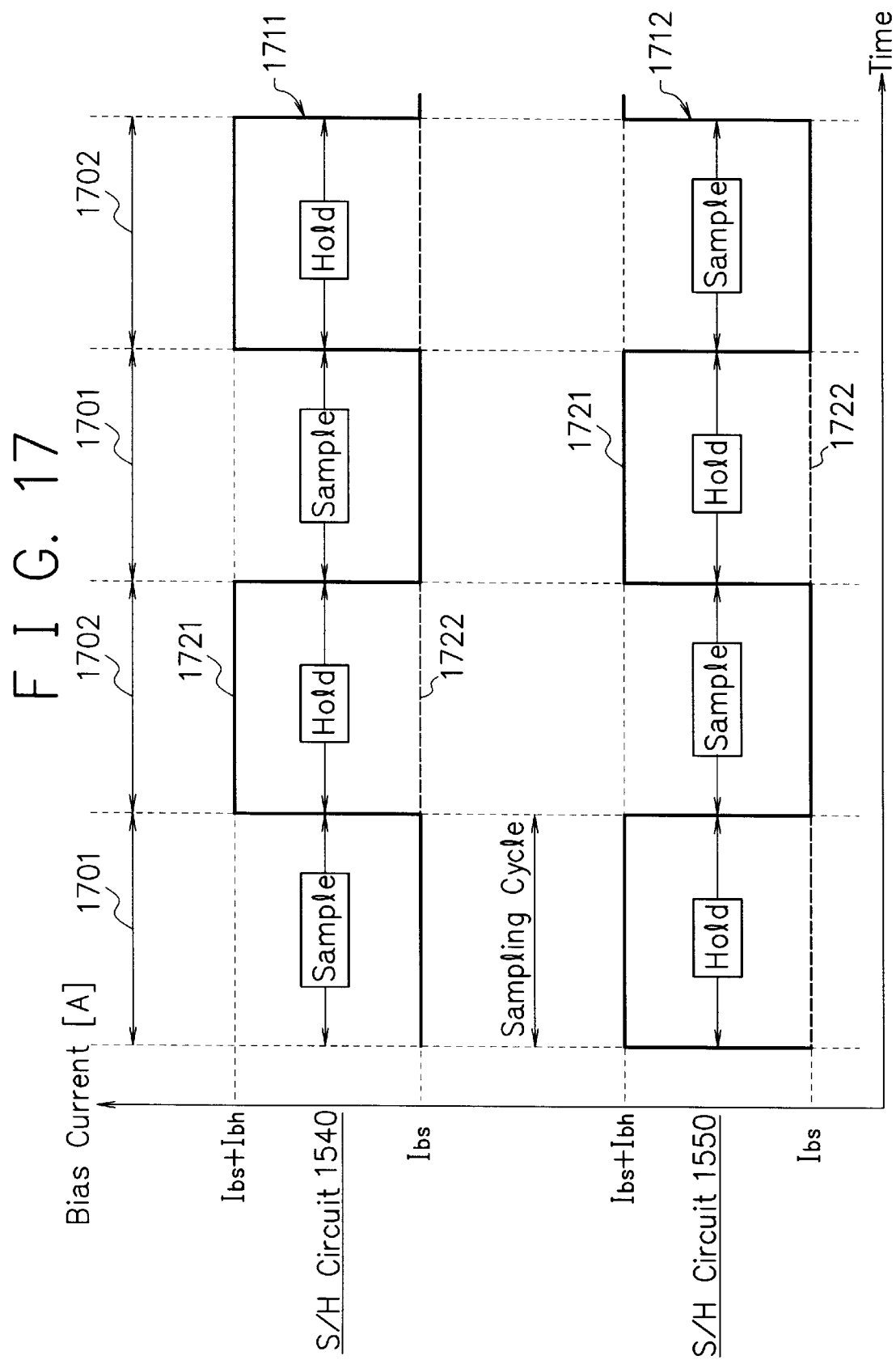

A/D CONVERTER WITH HIGHER SPEED AND ACCURACY AND LOWER POWER CONSUMPTION

CROSS-REFERENCE TO RELATED APPLICATIONS

This application is based upon and claims priority of Japanese Patent Application No. 2001-67049, filed on Mar. 9, 2001, the contents being incorporated herein by reference.

BACKGROUND OF THE INVENTION

1. Field of the Invention

The invention relates to an A/D converter for converting an input analog signal into a digital signal.

2. Description of the Related Art

With the rapid progress of digital signal processing technologies in recent years, sophistication is increasingly demanded of A/D converters which are the interfaces with analog circuits. Among high-speed, low-power configurations of A/D converters is an interpolation type two-stage serial parallel scheme.

FIG. 18 shows the configuration of a two-stage serial parallel type A/D converter described in Japanese Patent Laid-Open Publication No.Hei 3-157020. This A/D converter is a two-stage serial parallel type A/D converter which utilizes interpolation to perform A/D conversion in two stages consisting of an upper A/D conversion block 1831 and a lower A/D conversion block 1832.

The A/D converter comprises a reference voltage generating circuit 1801 composed of a series of resistors, a differential amplifier row 1802, a sample/hold (S/H) circuit row 1803, comparator rows 1804 and 1812, a switch row 1805, an upper encoder 1806, S/H circuits 1807 and 1808, differential amplifiers 1809 and 1810, a resistive interpolation circuit 1811, and a lower encoder 1813.

Initially, in the upper A/D conversion block 1831, the differential voltages between individual reference voltages obtained from the reference voltage generating circuit 1801 and an analog input voltage are amplified by the differential amplifier row 1802. The differential voltages are sampled/held by the S/H circuit row 1803. The differential voltages held by the S/H circuit row 1803 are compared in the comparator row 1804. The outputs of the comparator row 1804 are converted into binary digital code by the upper encoder 1806, obtaining an upper A/D conversion result 1821.

At the same time, the upper encoder 1806 generates a control signal CTL for turning on certain switches in the switch row 1805, so that differential voltages with two reference voltages in the vicinity of the input voltage, out of the differential voltages held by the S/H circuit row 1803 are transferred to the lower A/D conversion block 1832. The two differential voltages transferred are sampled/held by the S/H circuits 1807 and 1808. The noninverted outputs and inverted outputs of the differential amplifiers 1809 and 1810 are individually interpolated by the resistive interpolation circuit 1811. The resulting interpolated voltages are compared in the comparator row 1812. The lower encoder 1813 converts the outputs of the comparator row 1812 into binary digital code to obtain a lower A/D conversion result 1822.

Hereinafter, description will be given in conjunction with an operation timing chart of FIG. 19. A signal 1901 is a signal of the S/H circuit row 1803. A signal 1902 is a signal of the comparator row 1804. A signal 1903 is a signal of the selector switch 1805. A signal 1904 is a signal of the S/H circuits 1807 and 1808. A signal 1905 is a signal of the comparator row 1812. The signals 1901 and 1902 are signals 1911 of the upper A/D conversion block 1831. The signals 1904 and 1905 are signals 1912 of the lower A/D conversion block 1832. A conversion cycle 1921 of the A/D converter is the sum of period a1, b1, and c1.

The S/H circuit row 1803, after a sample mode in the period a1, changes from the sample mode to a hold mode. The held voltage is settled in the period b1. The comparator row 1804 starts its comparing operation in the period b1, and outputs the result in the period c1. At the same time, the encoder 1806 generates the upper A/D conversion result 1821 and a control signal CTL from the comparison outputs, and keeps certain switches 1805 on over the period c1. During the period c1 in which differential voltages are transferred from the upper A/D conversion block 1831 to the lower A/D conversion block 1832, the S/H circuits 1807 and 1808 are in a sample mode. The S/H circuits 1807 and 1808 change to a hold mode in the period a2.

On the other hand, at the period a2, the S/H circuit row 1803 returns to the sample mode. In the lower A/D conversion block 1832, the outputs of the interpolation circuit 1811 are settled in the period a2 before the comparator row 1812 starts its comparing operation. From the comparisons, the encoder 1813 outputs the lower A/D conversion result 1822 at the period b 2. It is the operating speed of the S/H circuit row 1803 that determines the conversion speed (sampling frequency) of the A/D converter. Thus, as shown in FIG. 19, the sum of the periods a1, b1, and c1 fixes the conversion cycle of this A/D converter.

In the interpolation type two-stage serial parallel scheme, the following three points are important, in terms of operating timing, to prevent a deterioration in conversion accuracy:

(1) Start the comparing operation of the comparator rows 1804 only after the S/H circuit row 1803 is sufficiently settled and stabilized in hold voltage.

(2) Secure longer time (period c1) for transferring differential voltages from the upper A/D conversion block 1831 to the lower A/D conversion block 1832 so that the S/H circuits 1807 and 1808 can well follow in sampling operation.

(3) Set the timing to turn off the switches 1805 for transferring differential voltages from the upper A/D conversion block 1831 to the lower A/D conversion block 1832 in advance of switching the S/H circuit row 1803 from the hold mode to the sample mode.

The interpolation type two-stage serial parallel scheme shown in FIG. 18 has the following problems. A rise in the number of bits to be converted in the lower stage increases the number of interpolation nodes by power of 2. In each interpolation node, the settling time of the interpolation voltage is determined by the time constant between the load capacitance and the interpolation resistance of that interpolation node. The greater the number of bits to be converted in the lower stage, the slower the operating speed of the interpolation circuit becomes. At higher conversion speeds, the interpolating operations therefore fail to follow the changes of the differential voltages transferred from the upper A/D conversion block, deteriorating the conversion accuracy in the lower stage.

From the foregoing it will be seen that when a high-speed high-resolution A/D converter is to be configured as shown in FIG. 18, the number of bits to be converted at the lower stage is appropriately set to a smaller value (no greater than 3 bits) so as to suppress an interpolation-originated deterioration in conversion accuracy. Nevertheless, due to its two-stage configuration consisting of upper and lower stages, the serial parallel type ends up requiring a greater number of bits in upper stage A/D conversion, to constitute a high-resolution A/D converter. This spoils the advantages of the serial parallel type over a full flash type, such as smaller parts numbers and a reduction in power consumption.

The S/H circuit row 1803 must remain in the hold mode until differential voltages are transferred to the lower A/D conversion block completely. This fixes the conversion speed of the A/D converter as shown in FIG. 19.

On the other hand, the comparator row 1804 starts comparisons in the period b1. This comparison start timing is preferably set as close to the end of period b1 as possible, considering the sufficient settling of the hold voltages in the S/H circuit row 1803. In reality, however, the encoder 1806 inevitably has a circuit-operation delay time before generating the control signal CTL for the switches 1805 out of the comparison outputs of the comparator row 1804. Therefore, if the comparison start timing is set too closer to the end of the period b1, the switches 1805 for transferring the differential voltages from the upper A/D conversion block 1831 to the lower A/D conversion block 1832 come to be turned on in the middle of the period c1, with a reduction in the actual transfer time. When the transfer time becomes shorter than the acquisition time of the S/H circuits 1807 and 1808, the differential voltages to be transferred to the lower A/D conversion block 1832 may not be settled sufficiently, contributing to a deterioration in the conversion accuracy of the lower A/D conversion block 1832.

From the foregoing it will be seen that the hold time of the S/H circuit row 1803, for the sake of preventing a deterioration in conversion accuracy, must be made longer than the sum total of the settling time of the hold voltages in the S/H circuit row 1803, the operation delay time of the encoder 1806, and the acquisition time of the S/H circuits 1807 and 1808 in the lower A/D conversion block 1832. This determines the conversion speed with respect to conversion accuracy.

Primary factors for integral nonlinear errors of the A/D converter are input/output nonlinear errors occurring in a differential amplifier row that lies in the input front end of the A/D converter, and input offset voltages. Of these, the nonlinear errors can be reduced by adjusting bias current and transistor size.

In contrast, the offset voltages occur in a random fashion due to such reasons as element variations and asymmetry in layout, and still vary by several to ten-odd millivolts even if the transistors are designed with greater size. At higher resolutions or low-power-voltage operations, A/D converters have an LSB as extremely small as several millivolts. Thus, the input offset voltages can easily deteriorate the conversion accuracy. Therefore, the correction of the input offset voltages leads to higher accuracy.

SUMMARY OF THE INVENTION

It is an object of the present invention to provide an A/D converter of higher speed.

Another object of the present invention is to provide an A/D converter of higher accuracy.

Still another object of the present invention is to provide an A/D converter of lower power consumption.

An A/D converter according to the presetn invention comprises: a reference voltage generating circuit for generating a plurality of reference voltages; a differential amplifier row including a plurality of differential amplifiers for receiving an analog input voltage at one input terminals and the individual reference voltages generated by the reference voltage generating circuit at the other input terminals, amplifying differential voltages between the analog input voltage and the individual reference voltages while maintaining positive/negative signs thereof, and outputting the resultant to between noninverted output terminals and inverted output terminals as potential differences; a first sample/hold circuit row including a plurality of first sample/hold circuits for sampling/holding the individual differential voltages output from the differential amplifier row; a second sample/hold circuit row for performing interleaving operations, having a pair of second and third sample/hold circuits connected to each output of the first sample/hold circuit row; a first comparator row including a plurality of comparators for determining whether the individual differential voltages held by the first sample/hold circuit row are positive or negative; and a first encoder for outputting digital code corresponding to the outputs of the first comparator row.

The second sample/hold circuit row includes the second and third sample/hold circuits which are connected in parallel to each output of the first sample/hold circuit row. When the second sample/hold circuits are in a sample mode, the third sample/hold circuits are brought into a hold mode so that the sample/hold circuits for sampling are alternated at conversion cycles. The alternation of the sample/hold circuits for sampling allows an increase in A/D conversion speed. Since stable hold time can be secure, it is possible to realize an A/D converter of higher accuracy.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 5 is a circuit diagram of a k-staged A/D converter according to the first embodiment;

FIG. 15 is a circuit diagram of an S/H circuit according to a fourth embodiment of the present invention;

FIG. 17 is a chart showing time variations in the bias current values of the differential amplifiers in the S/H circuit according to the fourth embodiment;

DETAILED DESCRIPTION OF THE PREFERRED EMBODIMENTS (First Embodiment)

Figure 1A:
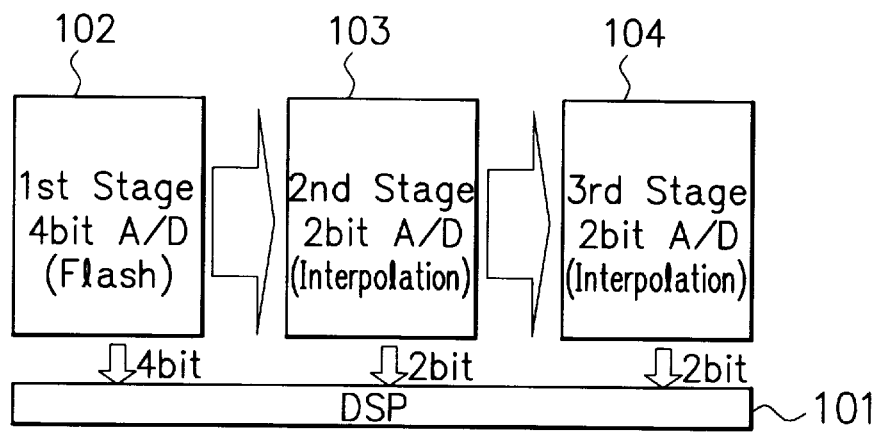
FIGS. 1A–1C are block diagrams showing multistage cascade interpolation type A/D converters according to a first embodiment of the present invention.
Figure 1B:
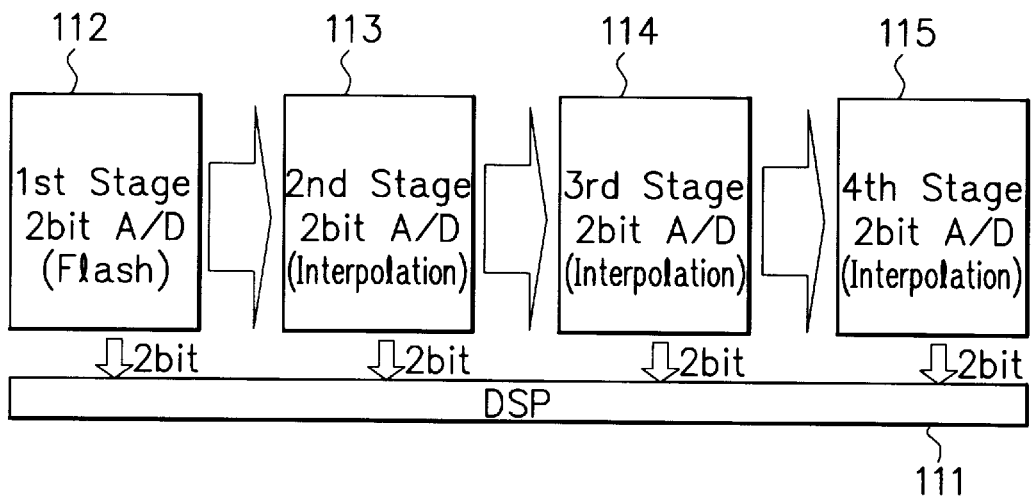
Figure 1C:
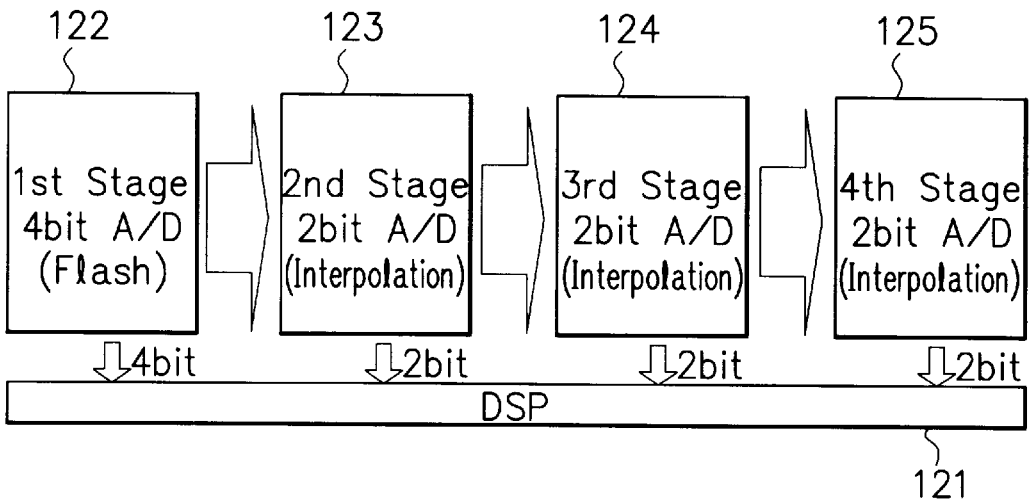

FIGS. 1A–1C are block diagrams showing configuration examples of A/D converters according to a first embodiment of the present invention.

FIG. 1A shows a first configuration example of an 8-bit A/D converter. This A/D converter comprises a first stage A/D conversion block 102, a second stage A/D conversion block 103, a third stage A/D conversion block 104, and a digital signal processor (DSP) 101. The first stage A/D conversion block 102 has a 4-bit configuration, the second stage A/D conversion block 103 a 2-bit configuration, and the third stage A/D conversion block 104 a 2-bit configuration. The DSP 101 receives 4-bit, 2-bit, and 2-bit digital signals from the three conversion blocks 102, 103, and 104, respectively, and outputs an 8-bit digital signal.

FIG. 1B shows a second configuration example of an 8-bit A/D converter. This A/D converter comprises a first stage A/D conversion block 112, a second stage A/D conversion block 113, a third stage A/D conversion block 114, a fourth stage A/D conversion block 115, and a DSP 111. The first stage A/D conversion block 112 has a 2-bit configuration, the second stage A/D conversion block 113 a 2-bit configuration, the third stage A/D conversion block 114 a 2-bit configuration, and the fourth stage A/D conversion block 115 a 2-bit configuration. The DSP 111 receives 2-bit, 2-bit, 2-bit, and 2-bit digital signals from the four conversion blocks 112, 113, 114, and 115, respectively, and outputs an 8-bit digital signal.

FIG. 1C shows a configuration example of a 10-bit A/D converter. This A/D converter comprises a first stage A/D conversion block 122, a second stage A/D conversion block 123, a third stage A/D conversion block 124, a fourth stage A/D conversion block 125, and a DSP 121. The first stage A/D conversion block 122 has a 4-bit configuration, the second stage A/D conversion block 123 a 2-bit configuration, the third stage A/D conversion block 124 a 2-bit configuration, and the fourth stage A/D conversion block 125 a 2-bit configuration. The DSP 121 receives 4-bit, 2-bit, 2-bit, and 2-bit digital signals from the four conversion blocks 122, 123, 124, and 125, respectively, and outputs a 10-bit digital signal.

Figure 2:
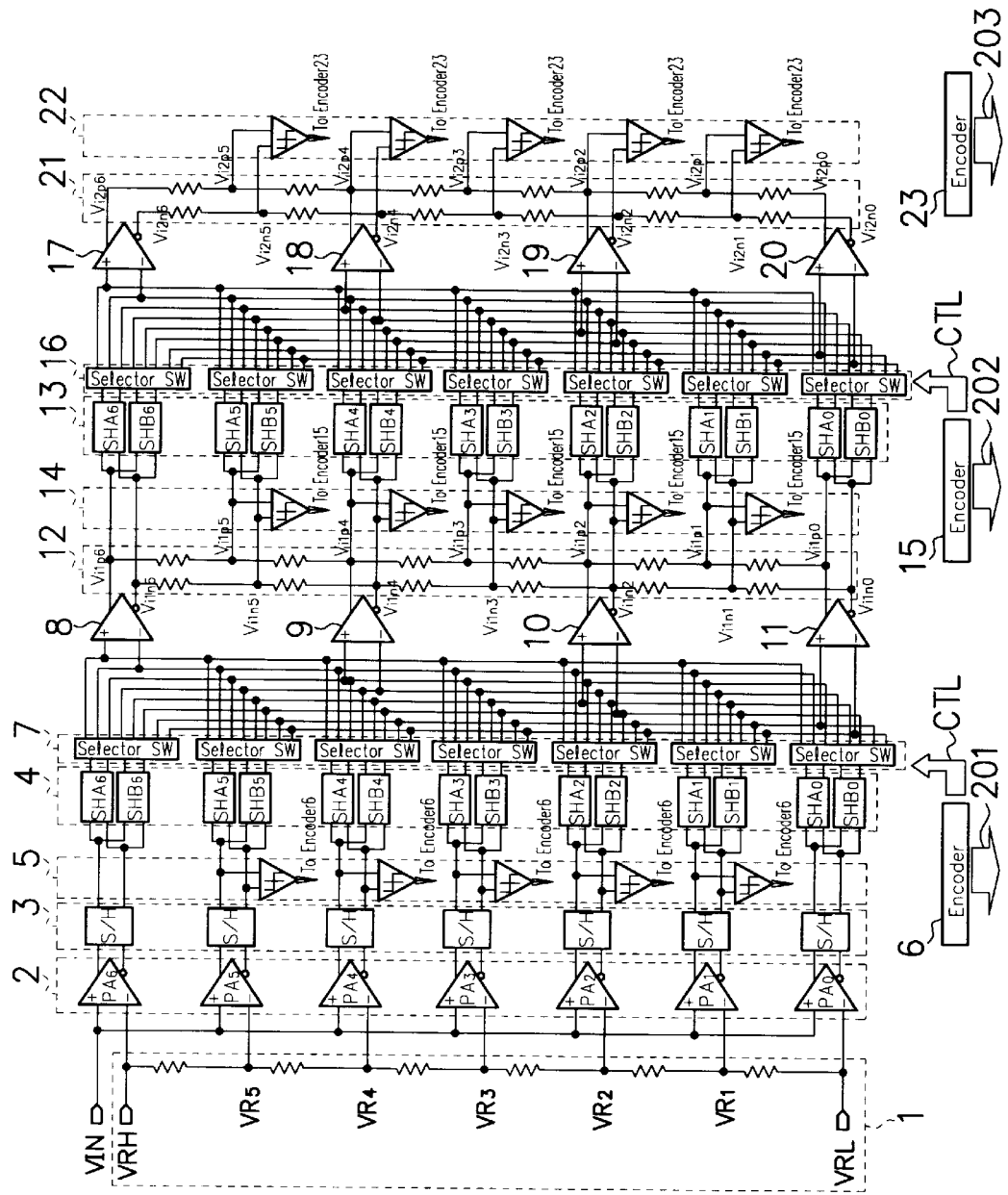
FIG. 2 is a circuit diagram of a three-staged 4-bit A/D converter according to the first embodiment.

FIG. 2 is a circuit diagram of an A/D converter according to the present embodiment. This A/D converter is a 4-bit A/D converter, having a first stage for 2-bit A/D conversion, a second stage for 1-bit A/D conversion, and a third stage for 1-bit A/D conversion in a three-stage cascade connection.

Initially, description will be given of the configuration of the first stage A/D conversion block. A reference voltage generating circuit 1 consists of a resistance element row, and generates new reference voltage levels $VR_1$–$VR_5$ from two reference voltages VRL and VRH. Here, the minimum voltage level of an analog input corresponds to $VR_1$, and the maximum voltage level to $VR_5$. The full scale range of this A/D converter is ($VR_5$–$VR_1$). VRL and VRH are used to generate the voltage levels to be input to differential amplifiers 11 and 8 when an analog input voltage is in the vicinities of $VR_1$ and $VR_5$, respectively. A differential amplifier row 2 consists of seven differential amplifiers. The differential amplifiers receive an analog input voltage VIN at the positive input terminals, and the individual reference voltages at the negative input terminals. The differential amplifiers linearly amplify differential voltages obtained by subtracting the reference voltages from the analog input voltage, and output the resultant through their noninverted and inverted outputs as potential differences.

A S/H circuit row 3 consists of seven S/H circuits, and samples/holds the noninverted and inverted output voltages from the differential amplifier row 2 at conversion cycles. A S/H circuit row 4 consists of 14 S/H circuits.

When the S/H circuit row 3 enters a hold mode, the S/H circuits SHA sample the noninverted and inverted outputs of the S/H circuit row 3. In the meantime, the S/H circuits SHB are in a hold mode. After a single conversion cycle, the S/H circuit row 3 holds next differential voltages, which are sampled by the S/H circuits SHB. Meanwhile, the S/H circuits SHA are in a hold mode. The S/H circuits SHA and SHB take turns to sample the outputs of the S/H circuit row 3 at conversion cycles.

A comparator row 5 consists of five comparators, and compares noninverted and inverted outputs of the S/H circuit row 3 in magnitude. Then, it outputs signals that indicate positive if noninverted outputs>inverted outputs, and negative if noninverted outputs<inverted outputs. The comparison outputs are transmitted to an encoder 6. When the encoder 6 makes the determination (referred to as boundary determination) that the analog input voltage level VIN falls within the range of $VR_k$<VIN<$VR_{k+1}$ (k is an integer in the range of 1 and 4), it outputs, according to the determination, a first stage A/D conversion result 201 in the form of 2-bit digital code.

Based on the determination, the encoder 6 also generates a control signal CTL for turning on selector switches 7 so that the noninverted output terminals and inverted output terminals of the S/H circuits $SHA(B)_{k-1}$, $SHA(B)_k$, $SHA(B)_{k+1}$, and $SHA(B)_{k+2}$ (k is an integer in the range of 1 and 4) that hold the differential voltages the comparator row 5 used in the comparison are connected to the positive input terminals and negative input terminals of the differential amplifiers 11, 10, 9, and 8 in the second stage, respectively. Incidentally, the reason why the voltages of the S/H circuits $SHA(B)_{k-1}$ and $SHA(B)_{k+2}$ are also transferred is as follows.

That is, even if the comparator row 5 makes incorrect positive/negative determinations on the weak differential voltages, and the encoder 6 consequently makes a boundary determination error such as $VR_{k+1}<VIN<VR_k$ or $VR_{k+1}<VIN<VR_{k+2}$ (k is an integer in the range of 1 and 4), the boundary determination error can be buffered as far as the adjacent boundaries.

The following shows an example of operation of the first stage. Assuming that the analog input VIN falls within the range of $VR_2<VIN<VR_3$, the outputs of the differential amplifiers $PA_0$–$PA_2$ have the relationship that noninverted output>inverted output. In contrast, the outputs of the differential amplifiers $PA_3$–$PA_6$ have the relationship that noninverted output<inverted output. These relationships also hold for the differential outputs of the S/H circuit row 3. The comparator row 5 makes a determination on these relationships, and sends the comparisons to the encoder 6 in the form of positive/negative signals. Based on the comparisons sent from the comparator row 5, the encoder 6 detects that the analog input voltage level VIN falls within the range of $VR_2<VIN<VR_3$ (in this case, the comparators made accurate positive/negative determinations), and outputs 2-bit digital code of "01." At the same time, the encoder 6 generates a control signal CTL for turning on selector switches 7 so that the noninverted output terminals and inverted output terminals of the S/H circuits $SHA_1$, $SHA_2$, $SHA_3$, and $SHA_4$ are connected to the positive input terminals and negative input terminals of the differential amplifiers 11, 10, 9, and 8 in the second stage, respectively.

Next, description will be given of the configuration of the second stage A/D conversion block. The differential amplifiers 8–11 amplify the voltages transferred from the first stage through the selector switches 7, and output the resultant through the noninverted and inverted outputs as potential differences. A resistive interpolation circuit 12 consists of twelve resistance elements. The noninverted and inverted outputs of the differential amplifiers 8 and 9, the noninverted and inverted outputs of the differential amplifiers 9 and 10, and the noninverted and inverted outputs of the differential amplifiers 10 and 11 are respectively divided by the resistances, and interpolated for a single bit to generate interpolation nodes of voltages $V_{i1pm}$ and $V_{i1nm}$ (m is an integer in the range of 0 and 6). A S/H circuit row 13 consists of 14 S/H circuits. The S/H circuits SHC and SHD sample the outputs $V_{i1pm}$ and $V_{i1nm}$ of the interpolation circuit 12 alternately at conversion cycles.

A comparator row 14 consists of five comparators, and compares the voltages $V_{i1pm}$ and $V_{11nm}$ in magnitude. Here, assuming that no boundary determination error is made by the encoder 6, the differential amplifiers 8 and 9 have the relationship that noninverted output<inverted output, and the differential amplifiers 10 and 11 the relationship that noninverted output>inverted output. Thus, the interpolation nodes that satisfy $V_{i1pm}<V_{i1nm}$ come between the differential amplifiers 9 and 10. If any boundary determination error is made by the encoder 6, however, the nodes come either between the differential amplifiers 8 and 9 or between the differential amplifiers 10 and 11.

Based on the outputs of the comparator row 14, an encoder 15 detects the boundary across which the voltages $V_{i1pm}$ and $V_{i1nm}$ are reversed in magnitude relationship. If that boundary is determined to fall between the differential amplifiers 9 and 10, the encoder 15 outputs a second stage A/D conversion result 202, or 1-bit digital code.

On the other hand, if the boundary is determined to fall between the differential amplifiers 8 and 9 or between the differential amplifiers 10 and 11, then the 1-bit digital code, the second stage A/D conversion result 202, is output to the DSP 101, 111, or 121 of FIGS. 1A–1C, along with code for digitally correcting the least significant one bit of the 2-bit digital code which is the first stage A/D conversion result 201. The DSP 101, 111, or 121 digitally corrects the least significant one bit mentioned above.

Moreover, as in the first stage, the encoder 15 generates a control signal CTL for turning on selector switches 16 so that the noninverted output terminals and inverted output terminals of the S/H circuits $SHC(D)_{m-1}$, $SHC(D)_m$, $SHC(D)_{m-1}$, and $SHC(D)_{m+2}$ (m is an integer in the range of 1 and 4) that hold the interpolation voltages the comparator row 14 used in the comparison are connected to the positive input terminals and negative input terminals of differential amplifiers 20, 19, 18, and 17 in the third stage, respectively.

Next, description will be given of the configuration of the third stage A/D conversion block. The differential amplifiers 17–20 amplify the voltages transferred from the second stage through the selector switches 16, and output the resultant through the noninverted and inverted outputs as potential differences. A resistive interpolation circuit 21 consists of twelve resistance elements. The noninverted and inverted outputs of the differential amplifiers 17 and 18, the noninverted and inverted outputs of the differential amplifiers 18 and 19, and the noninverted and inverted outputs of the differential amplifiers 19 and 20 are respectively divided by the resistances, and interpolated for a single bit to generate interpolation nodes of voltages $V_{i2pm}$ and $V_{i2nm}$ (m is an integer in the range of 0 and 6).

A comparator row 22 consists of five comparators, and compares the voltages $V_{i2pm}$ and $V_{i2nm}$ in magnitude. Here, on the assumption that no boundary determination error is made by the encoder 15, the differential amplifiers 17 and 18 have the relationship that noninverted output<inverted output, and the differential amplifiers 19 and 20 the relationship that noninverted output>inverted output. Thus, the interpolation nodes that satisfy $V_{i2pm}<V_{i2nm}$ come between the differential amplifiers 18 and 19. If any boundary determination error is made by the encoder 15, however, the nodes come either between the differential amplifiers 17 and 18 or between the differential amplifiers 19 and 20.

From the outputs of the comparator row 22, an encoder 23 detects the boundary across which the voltages $V_{i2pm}$ and $V_{i2nm}$ are reversed in magnitude relationship. If that boundary is determined to fall between the differential amplifiers 18 and 19, the encoder 23 outputs a third stage A/D conversion result 203, or 1-bit digital code.

On the other hand, if the boundary is determined to fall between the differential amplifiers 17 and 18 or between the differential amplifiers 19 and 20, the 1-bit digital code, the third stage A/D conversion result, is output to the DSP 101, 111, or 121 of FIGS. 1A–1C, along with code for digitally correcting the least significant one bit of the 1-bit digital code which is the second stage A/D conversion result.

Finally, the DSP 101, 111, or 121 determines the total sum of the A/D conversion outputs 201, 202, and 203 from the individual stages, and performs necessary correction to obtain a 4-bit A/D conversion result for the analog input VIN. For example, when first-stage digital code of "01," second-stage digital code of "1," and third stage digital code of "0" are output for a certain analog input, and no digital correction occurs in the second and third stages, the 4-bit digital code for that analog input is "0110."

Figure 3:
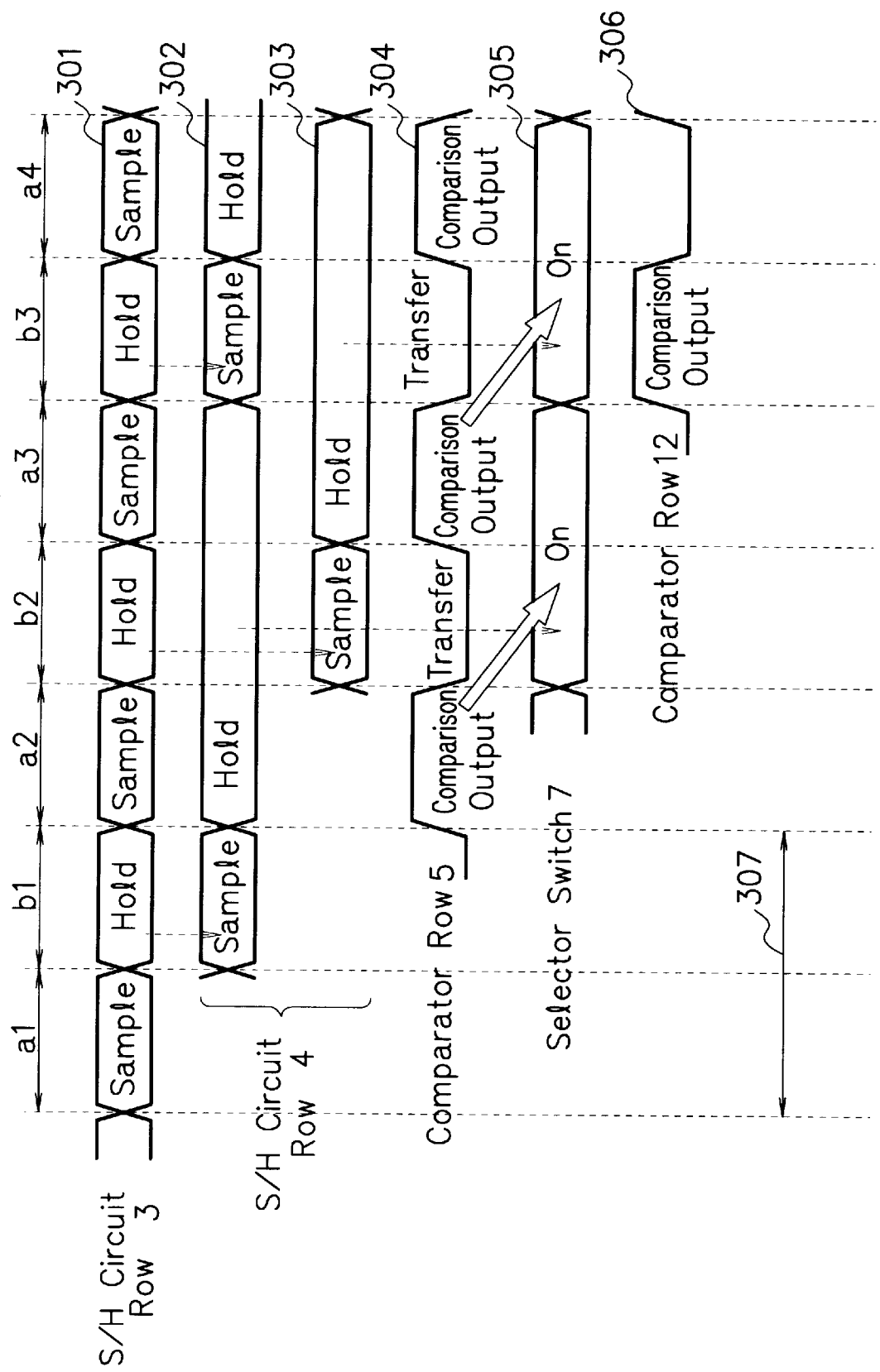
FIG. 3 is an operation timing chart of the A/D converter according to the first embodiment.

FIG. 3 is an operation timing chart of the A/D converter. A signal 301 is a signal of the S/H circuit row 3. A signal 302 is a signal of a S/H circuit SHA in the S/H circuit row 4. A signal 303 is a signal of a S/H circuit SHB in the S/H circuit row 4. A signal 304 is a signal of the comparator row 5. A signal 305 is a signal of a selector switch 7. A signal 306 is a signal of the comparator row 12. The total of periods a1 and b1 is a conversion cycle 307 of the A/D converter. The signal 301 alternates between sample and hold at equal intervals.

As soon as the S/H circuit row 3 is switched from a sample mode to a hold mode to settle its hold voltages in the period b1, half the S/H circuits in the S/H circuit row 4 sample the hold voltages. The comparator row 5 starts its comparing operations immediately before the end of the period b1, and outputs the comparisons in the period a2. Within the period a2, the encoder 6 completes operation based on the comparisons. The encoder 6 outputs the first stage A/D conversion result in the period b2, and generates a control signal CTL to turn certain switches 7 on over the periods b2 and a3, transferring differential voltages from the first stage to the second stage.

The outputs of the interpolation circuit 12 are settled in the periods b2–a3 before the comparator row 13 starts comparing operations. From the comparisons, the encoder 14 outputs the second A/D conversion result in the period b3. Meanwhile, in the period a2, the S/H circuit row 3 reenters a sample mode. The S/H circuit row 3 is switched into a hold mode in the period b2, so that the other S/H circuits in the S/H circuit row 4 make the same operations as described above. It is the operating speed of the S/H circuit row 3 that determines the conversion speed (sampling frequency) of the A/D converter. Thus, as shown in FIG. 3, the sum of the periods a1 and b1 fixes a conversion cycle 307 of the A/D converter.

In short, the S/H circuit row 4 is inserted with aims as follows:
(1) The operations of the S/H circuit row 3 and the operations of transferring differential voltages from the upper to lower stages are pipelined for temporal independence. This narrows the requirements for the hold time of the S/H circuit row 3 to the setting time of the hold voltages.
(2) The operating cycles of the two S/H circuits SHA and SHB are rendered twice the conversion cycle so that the transferring time from the upper to lower stages is always secured as much as the conversion cycle. The reason for this is that deteriorations in conversion accuracy at the lower stages resulting from insufficient transferring time are reduced.

Figure 19:
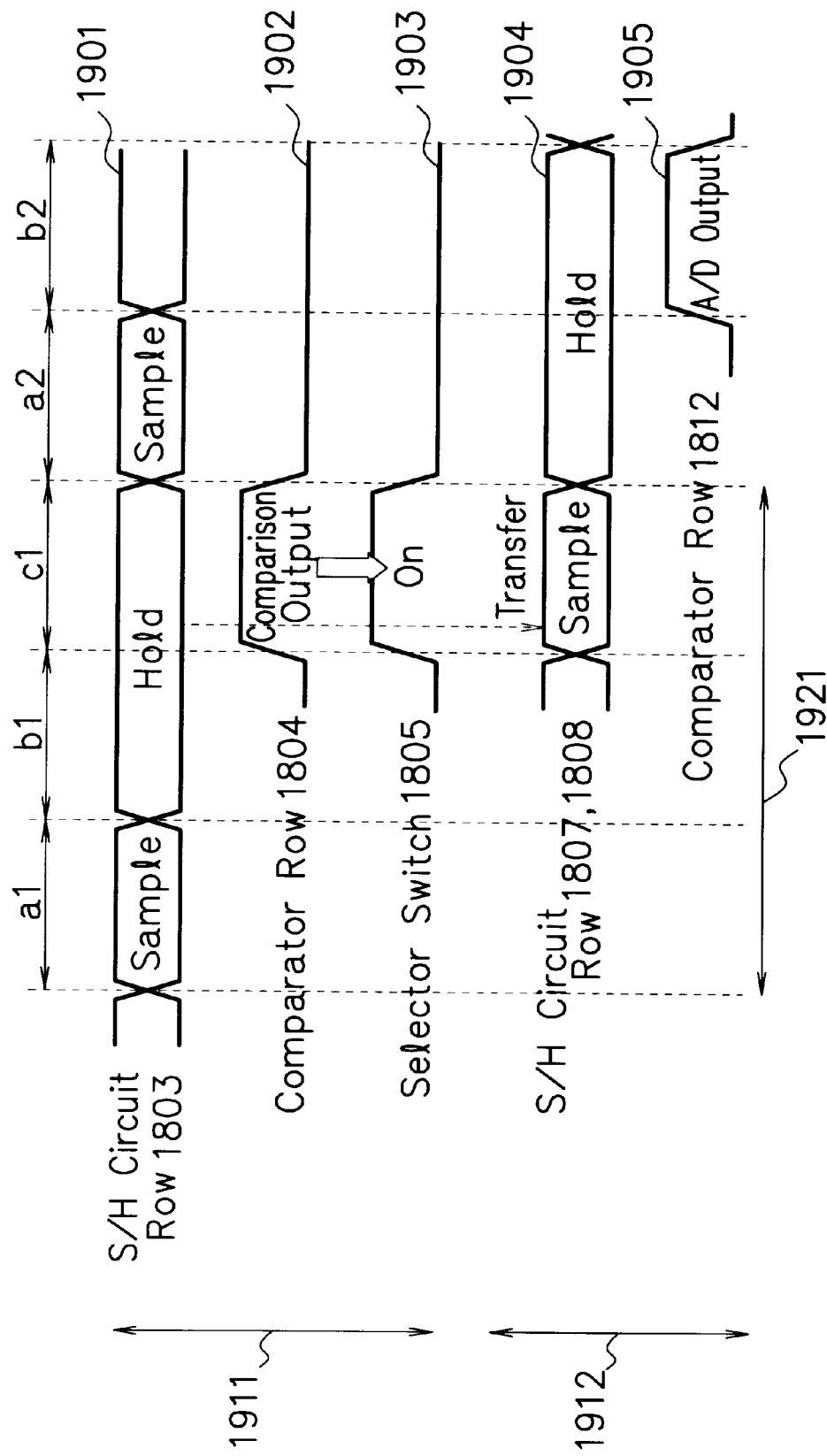
FIG. 19 is an operation timing chart of the A/D converter according to the conventional art.

As also can be seen from the two timing charts of FIG. 19 and FIG. 3, the present embodiment achieves conversion speed at least twice or much higher than that of the conventional scheme while securing the same transferring time.

Figure 4:
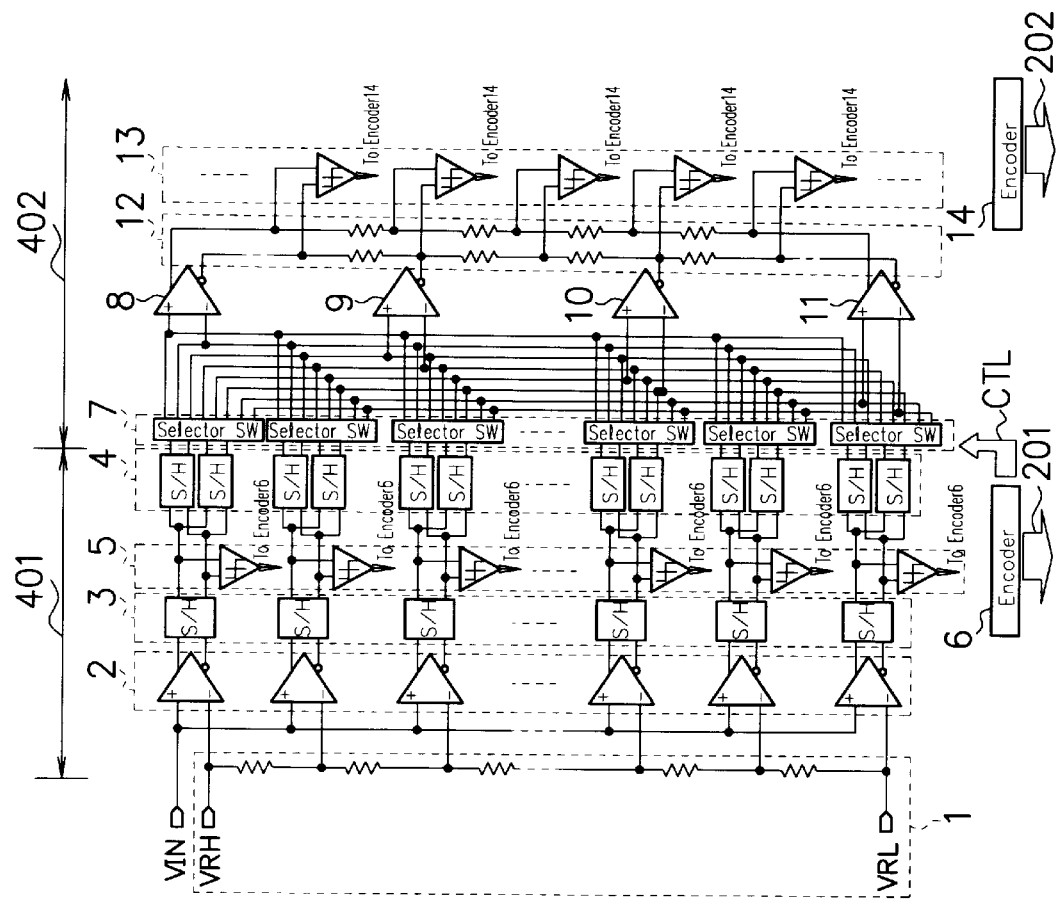
FIG. 4 is a circuit diagram of a double-staged A/D converter according to the first embodiment.

FIG. 4 shows a configuration example of an A/D converter having a two-stage configuration. This A/D converter has a first stage A/D conversion block 401 and a second stage A/D conversion block 402. An encoder 6 outputs a conversion result 201 of the first stage A/D conversion block 401. An encoder 14 outputs a conversion result 202 of the second stage A/D conversion block 402.

FIG. 5 shows a configuration example of a multistage cascade interpolation type A/D converter having a k-stage configuration. Here, k is an integer not smaller than 2, which means an A/D converter having two or more stages. This A/D converter comprises a first stage A/D conversion block 501, a second stage A/D conversion block 502, third to (k−1)th stage A/D conversion blocks 503, and a kth stage A/D conversion block 504.

In the present embodiment, the k stages (k is an integer greater than or equal to 2) of A/D conversion blocks are cascaded. The second and subsequent stages each perform A/D conversion only on data interpolations sent from the A/D conversion blocks at their immediate upper stages. In front of the selector switches in each A/D conversion block, two S/H circuits which operate at cycles twice the conversion cycles are inserted in parallel for each reference voltage level or interpolation voltage level, so as to perform sampling alternately at the conversion cycles.

According to the multistage cascade configuration which is the basic configuration of the present invention, the number of stages of blocks and the number of bits to be converted in each stage can be freely determined by designers in conformity to specification requirements such as conversion speed and resolution. FIGS. 1A–1B show configuration examples of 8-bit and 10-bit A/D converters.

Features of the present embodiment include:
(1) Feasible even if higher resolutions are required, by connecting A/D conversion blocks having low resolutions of 1–2 bits into multistages.
(2) The lower the interpolation resolutions, the smaller the number of interpolation nodes. This allows high speed interpolation operations.
(3) The resistive interpolation circuits consist of series of impedance elements alone, and are originally smaller in power consumption. Thus, the power consumption remains small even after the multistage connection of the A/D conversion blocks.

As has been described, according to the present embodiment, it is possible to constitute an A/d converter of higher speed, higher resolution, and lower power consumption. In addition, the A/D conversion blocks advantageously have S/H circuit rows for operating at cycles twice the conversion cycles, inserted immediately before the respective selector switches.

Figure 6:
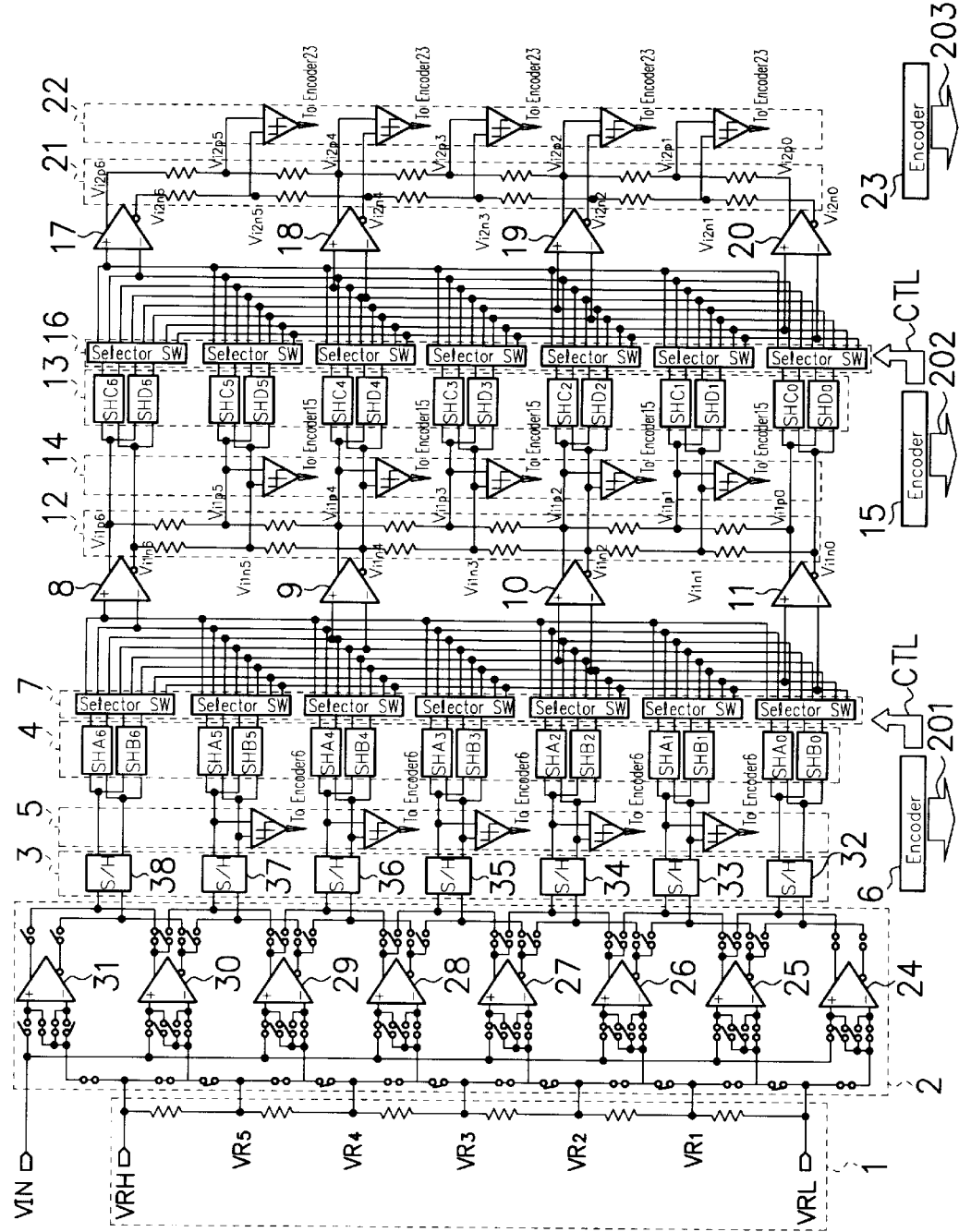
FIG. 6 is a circuit diagram of an A/D converter according to a second embodiment of the present invention.

(Second Embodiment)
FIG. 6 shows an A/D converter according to a second embodiment of the present invention. A differential amplifier row 2 in the present embodiment has one extra differential amplifier as compared with the differential amplifier row 2 in the first embodiment shown in FIG. 2. This differential amplifier row 2 is a differential amplifier row on the input front end of the A/D converter. The individual differential amplifiers 24–31 of the differential amplifier row 2 have the circuit configuration of FIG. 8A.

Figures 8A, 8B:
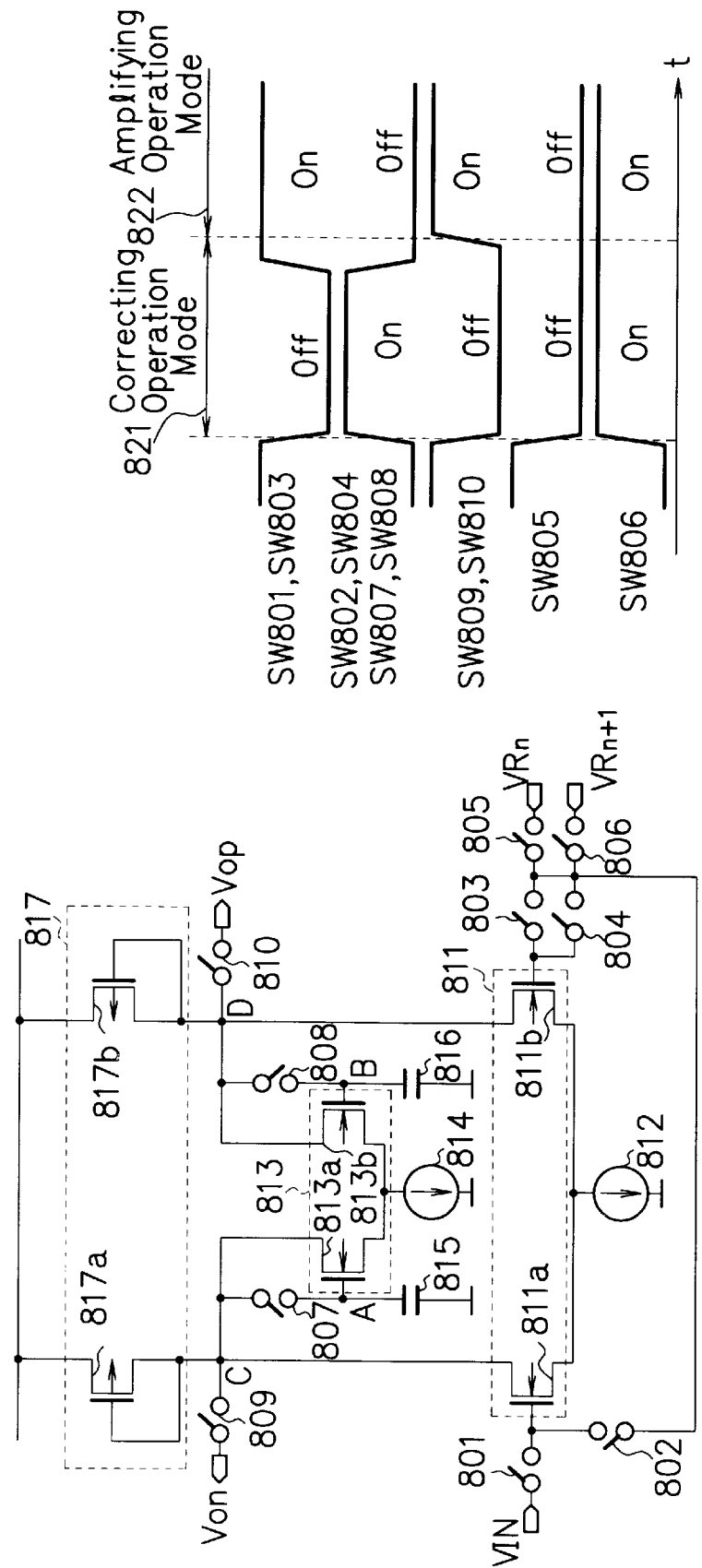
FIG. 8A is a circuit diagram of a differential amplifier according to the second embodiment.
FIG. 8B is a timing chart showing the operations of the differential amplifier.

FIG. 8A is a circuit diagram of a differential amplifier according to the second embodiment. A differential pair transistor (hereinafter, referred to as differential pair) 811 has n-channel MOS transistors 811a and 811b. A differential pair 813 has n-channel MOS transistors 813a and 813b. P-channel MOS transistors 817a and 817b have their gates and drains connected to each other, functioning as resistors. The resultant resistors 817a and 817b constitute an output resistance circuit (load circuit) 817.

The differential pair 811 functions as an input unit in an amplifying operation mode. The differential pair 813 shares the individual drain terminals with the differential pair 811. Capacitance elements 815 and 816 are connected to between the respective gate terminals of the differential pair 813 and a ground. The output resistance circuit 817 is connected to the shared drain terminals of the differential pairs 811 and 813. Switches 807 and 808 can short the differential output terminals and the respective gate terminals of the differential pair 813. Switches 801, 803–806, 809, and 810 can switch inputs/outputs depending on whether an amplifying operation mode or an offset correcting operation mode.

FIG. 8B shows ON/OFF control signals for the switches in an offset correcting operation mode 821 and an amplifying operation mode 822. The high and low levels represent ON and OFF states, respectively.

In the correcting operation mode 821, as shown in the operation timing chart of FIG. 8B, the switches 801, 803, 809, and 810 are turned off. The switches 802, 804, 807, and 808 are turned on.

The switches 805 and 806 are kept so that either of them is always in an ON state. The switches are changed over in entering a correcting operation. Once changed over, they keep their states until the next correcting operation. In the cases of the differential amplifiers at both ends of the differential amplifier row, no changeover occurs between $VR_n$ and $VR_{n+1}$ so that the same reference voltage (VRL or VRH) is input all the time. Hereinafter, the correcting and amplifying operations will be described in sequence. As employed herein, symbols gm1 and gm2 represent the transconductances of the differential pairs 811 and 813, respectively. Symbols $V_{off1}$ and $V_{off2}$ represent the input offset voltages of the differential pairs 811 and 813 resulting from element variations, respectively.

Initially, description will be given of the correcting operation. The time for a correcting operation mode is set to be several times longer than a sampling cycle (conversion cycle). When the switches 801, 803 are turned off and the switches 802, 804 are turned on, a reference voltage $VR_{n+1}$ is input to both gate terminals of the differential pair 811. Incidentally, the aim of the switch 803 is to match the numbers of switches to be connected to both gate terminals of the differential pair 811 so that switch-originated charge injection noises at both gate terminals balance as closely as possible.

Meanwhile, the switches 807 and 808 are also turned on, whereby the gate terminals A and B of the differential pair 813 are shorted to the differential output terminals C and D of the differential amplifier, respectively, for the sake of negative feedback (so-called auto-zero operation). This negative feedback functions to nullify the potential difference between the differential output terminals C and D. The potential difference approaches zero as the value of gm2×R increases, where R is the output resistance of the output resistance circuit 817. When the differential pairs 811 and 813 have the input offset voltages, this negative feedback brings the output potential difference closer to the following expression:

$$\frac{gm1 \cdot V_{off1}}{\frac{1}{R}+gm2} + \frac{gm2 \cdot V_{off2}}{\frac{1}{R}+gm2}$$

Then, at the completion of the negative feedback, the voltages on the gate terminals A and B of the differential pair 813 are charged into the capacitors 815 and 816 to store the output potential difference described above. To suppress leakage of charge, the capacitors 815 and 816 are provided with a capacitance not smaller than several hundreds of femtofarads. If this capacitance is greater and requires longer time for the negative feedback operation, the time for the correcting operation mode is extended accordingly.

Next, description will be given of the amplifying operation mode 822. The switches 802, 804 are turned off and the switches 801, 803 are turned on so that the analog input VIN and the reference voltage $VR_{n+1}$ are input to the gate terminals of the differential pair 811. Meanwhile, the switches 807 and 808 are turned off to eliminate the negative feedback. Even after the switches 807 and 808 are turned off, the capacitors 815 and 816 maintain the gate terminals A and B of the differential pair 813 to the voltages at the completion of the correcting operation. The voltages stored in the capacitors 815 and 816 are voltages to bias the inputs of the differential pair 813 so as to nullify the potential difference between the differential outputs when the differential pair 811 has an input VIN=$VR_{n+1}$. This means that the input offset voltage of the differential pair 811 is corrected. After the offset correcting operation, the input offset voltage of the differential pair 811 is expressed by the following equation (1):

$$V_{offset} = \frac{1}{1+gm2 \cdot R} V_{off1} + \frac{\frac{gm2}{gm1}}{1+gm2 \cdot R} V_{off2} \quad (1)$$

From the equation (1), it can be seen that the greater the value of gm2 or R, the more the input offset voltage is reduced by the correction.

Figure 13A:
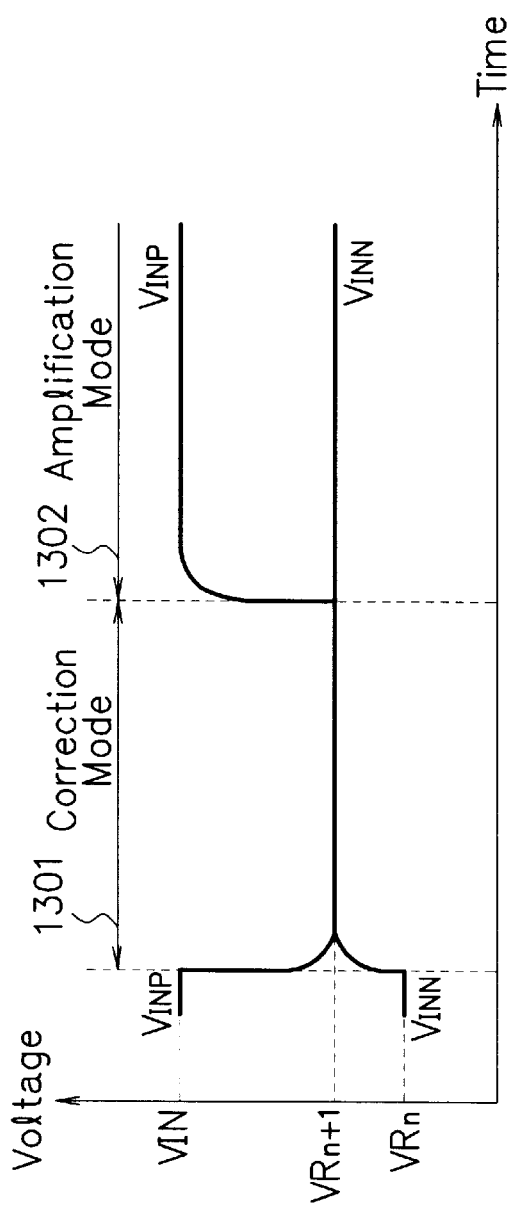
FIGS. 13A and 13B are diagrams showing time variations in voltage in an offset correcting operation mode and an amplifying operation mode.
Figure 13B:
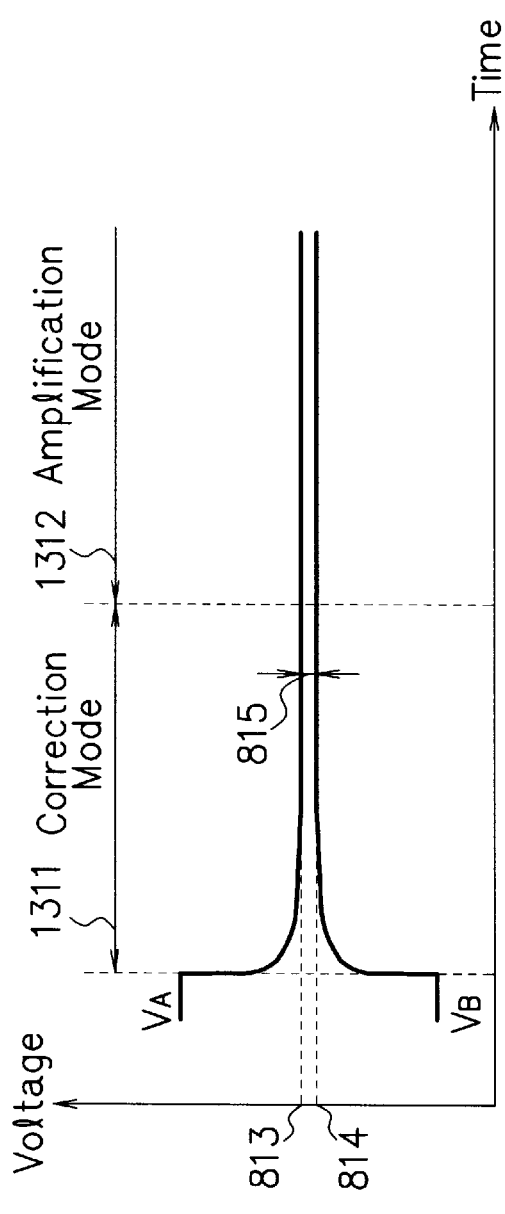

FIG. 13A shows the time variations of voltages $V_{INP}$ and $V_{INN}$ in a correction mode 1301 and an amplification mode 1302. FIG. 13B shows the time variations of voltages $V_A$ and $V_B$ in a correction mode 1311 and an amplification mode 1312. The voltage $V_{INP}$ is the voltage on the gate of the transistor 811a. The voltage $V_{INN}$ is the voltage on the gate of the transistor 811b. The voltage $V_A$ is the voltage on the gate of the transistor 813a. The voltage $V_B$ is the voltage on the gate of the transistor 813b.

Figure 9:
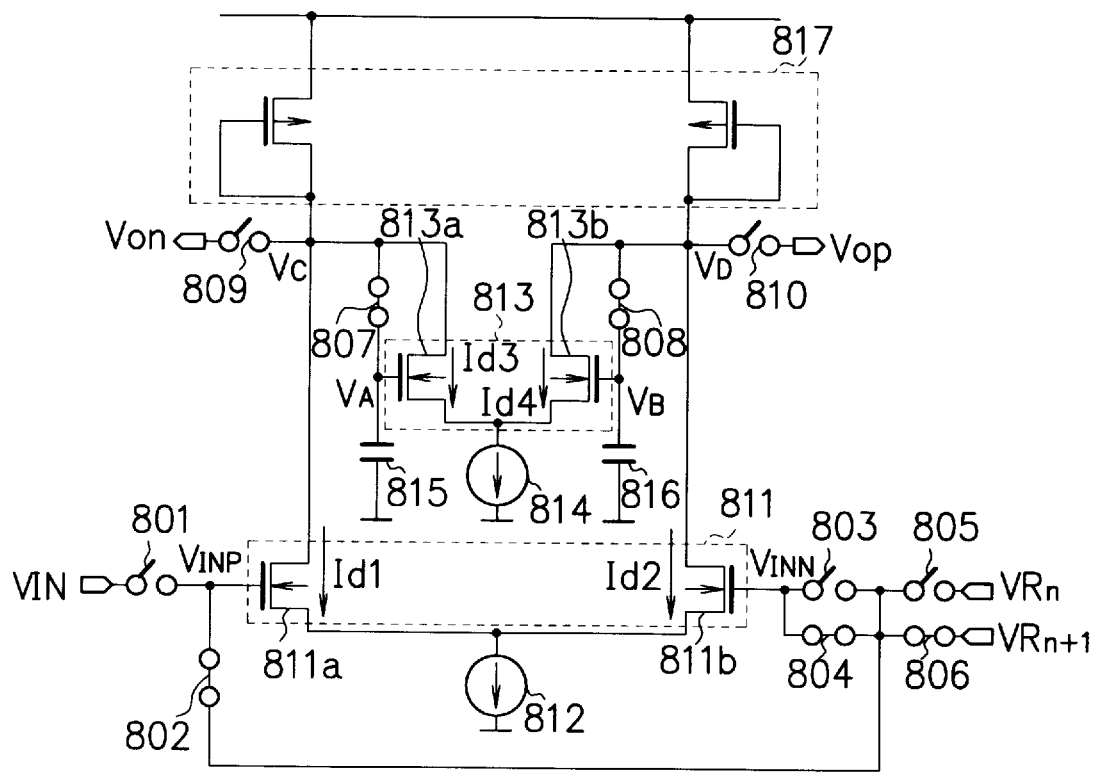
FIG. 9 is a circuit diagram of the differential amplifier in an offset correcting operation mode.

FIG. 9 shows the state of connection of the differential amplifiers in an offset correcting operation mode. In a correcting operation, the switches 802, 804, 806, 807, and 808 are turned on. The other switches are turned off. The differential pair 811 receives VR at both inputs. The differential outputs are shorted to the inputs of the differential pair 813, thereby forming negative feedback. Here, the voltages of the individual nodes are given by the following equations (2)–(4):

$$V_{INP}=V_{INN}=VR_{n+1} \quad (2)$$

$$V_A=V_C \quad (3)$$

$$V_B=V_D \quad (4)$$

Figure 10A:
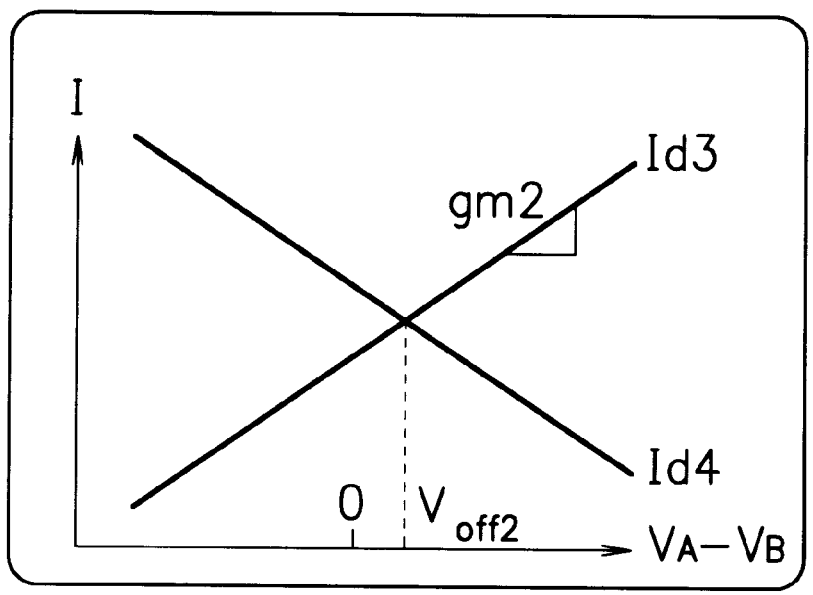
FIG. 10A is a diagram showing the voltage-current characteristic of a second differential pair.
Figure 10B:
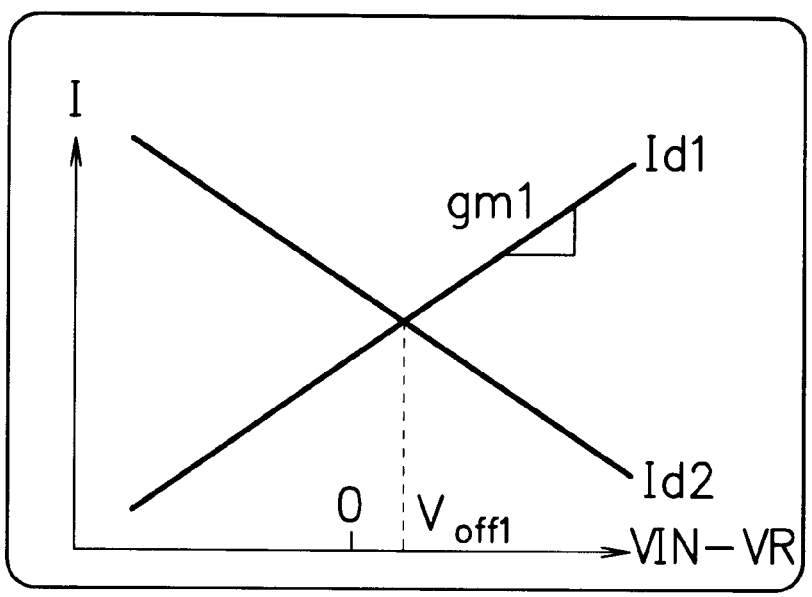
FIG. 10B is a diagram showing the voltage-current characteristic of a first differential pair.

FIG. 10A shows an example of the voltage-current characteristic of the differential pair 813. FIG. 10B shows an example of the voltage-current characteristic of the differential pair 811. As shown in FIGS. 10A and 10B, the offset voltages of the differential pairs 811 and 813 are $V_{off1}$ and $V_{off2}$, respectively. Take, for example, the differential pair 811. Ideally, when the differential input voltages VIN=VR (or VIN−VR=0), a current Id1 occurring in the transistor 811a and a current Id2 occurring in the transistor 811b become Id1=Id2. Because of element variations and the like, however, the differential input voltage that makes Id1=Id2 deviates from zero. In the case of FIG. 10B, Id1=Id2 when VIN=VR+$V_{off1}$. Here, $V_{off1}$ is referred to as input offset voltage (more specifically, input conversion offset voltage).

Given that the transconductances of the differential pairs 811 and 813 are gm1 and gm2, respectively, the currents Id1, Id2, Id3, and Id4 to flow through the transistors 811a, 811b, 813a, and 813b are given by the following equations (5)–(8):

$$Id1=gm1*VR_{n+1} \quad (5)$$

$$Id2=gm1*(VR_{n+1}+V_{off1}) \quad (6)$$

$$Id3=gm2*V_A \quad (7)$$

$$Id4=gm2*(V_B+V_{off2}) \quad (8)$$

From the currents of the above-mentioned equations (5)–(8), voltages $V_C$ and $V_D$ are expressed by the following equations (9) and (10), where R is the resistance of the output resistance circuit. 817. The voltage $V_C$ is the voltage on the drain of the transistor 813a. The voltage $V_D$ is the voltage on the drain of the transistor 813b.

$$V_C = -(Id1+Id3)*R = -(gm1*VR_{n+1}+gm2*V_A)*R \quad (9)$$

$$V_D = -(Id2+Id4)*R = -\{gm1*(VR_{n+1}+V_{off1})+gm2*(V_B+V_{off2})\}*R \quad (10)$$

Substituting the equations (3) and (4) into the equations (9) and (10), followed by rearrangement, obtains the voltages $V_A$ and $V_B$ of the differential pair after the stabilization of the negative feedback, as given by the following equations (11) and (12). The equations (10) and (11) trace the voltages 813 and 814 of FIG. 13B.

$$V_A = -\frac{gm1 \cdot R \cdot VR_{n+1}}{1+gm2 \cdot R} \quad (11)$$

$$V_B = -\frac{gm1 \cdot R(VR_{n+1}+V_{off1}) + gm2 \cdot R \cdot V_{off2}}{1+gm2 \cdot R} \quad (12)$$

From the equations (11) and (12), a potential difference $V_A-V_B$ in the differential pair 813 is given by the following equation (13). The equation (13) traces the voltage 815 of FIG. 13B.

$$V_A - V_B = \frac{gm1 \cdot V_{off1}}{\frac{1}{R}+gm2} + \frac{gm2 \cdot V_{off2}}{\frac{1}{R}+gm2} \quad (13)$$

Here, greater R brings the output potential difference $V_A-V_B$ closer to the following equation (14):

$$V_A - V_B = \frac{gm1}{gm2}V_{off1} + V_{off2} \quad (14)$$

After the completion of the correcting operation, the voltages $V_A$ and $V_B$ are held by the capacitors 815 and 816, respectively. The closer to the equation (14) these held voltages are, the more the input offset voltage is reduced at the time of amplification.

Figure 11:
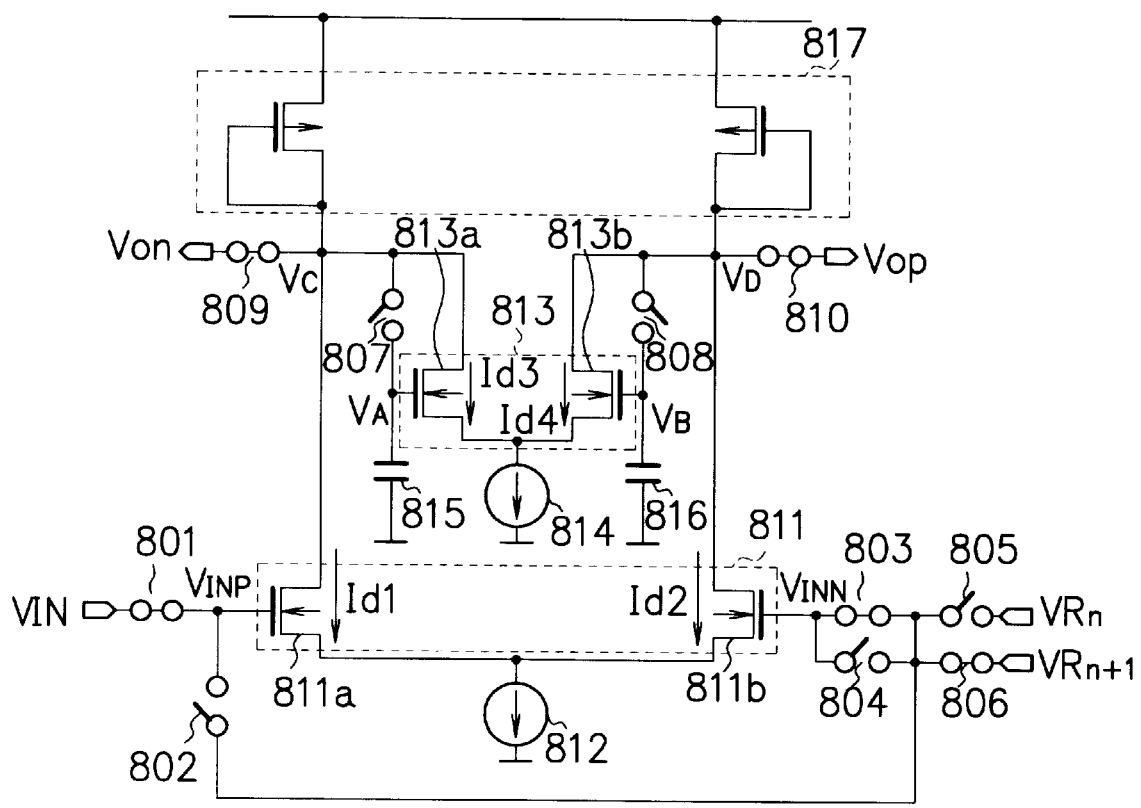
FIG. 11 is a circuit diagram of the differential amplifier in an amplifying operation mode.

FIG. 11 shows the state of connection of the differential amplifiers in an amplifying operation mode. In an amplifying operation, the switches 801, 803, 806, 809, and 810 are turned on. The other switches are turned off. The inputs of the differential pair 811 receive VIN and VR. The differential outputs are subsequently connected to a S/H circuit in the next stage. Here, the voltages of the individual nodes are given by the following equations (15)–(18). The voltage $V_{INP}$ is the voltage on the gate of the transistor 811a. The voltage $V_{INN}$ is the voltage on the gate of the transistor 811b. The voltage $V_C$ is the voltage on the drain of the transistor 813a. The voltage $V_D$ is the voltage on the drain of the transistor 813b.

$$V_{INP}=VIN \quad (15)$$

$$V_{INN}=VR_{n+1} \quad (16)$$

$$V_C=V_{on} \quad (17)$$

$$V_D=V_{op} \quad (18)$$

The voltages $V_A$ and $V_B$ are maintained at the values given by the equations (11) and (12), respectively. The currents Id1, Id2, Id3, and Id4 to flow through the transistors 811a, 811b, 813a, and 813b are given by the following equations (19)–(22):

$$Id1=gm1*VIN \quad (19)$$

$$Id2=gm1*(VR_{n+1}+V_{off1}) \quad (20)$$

$$Id3=gm2*V_A \quad (21)$$

$$Id4=gm2*(V_B+V_{off2}) \quad (22)$$

Figure 12A:
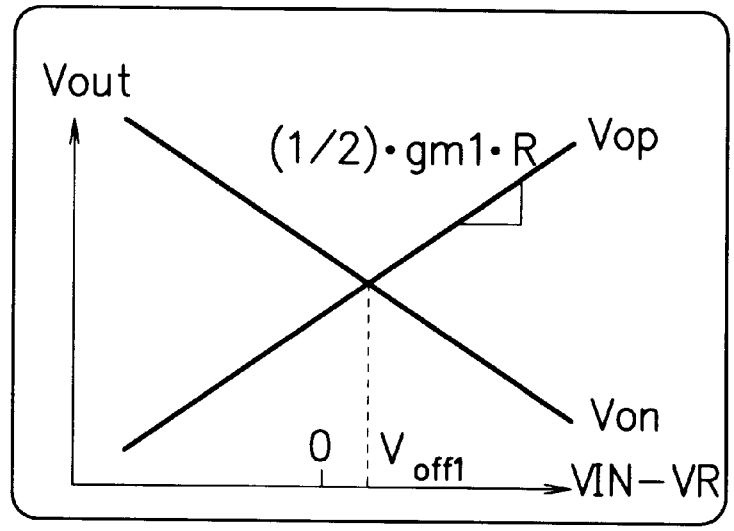
FIG. 12A is a diagram showing an input/output voltage characteristic before correction.
Figure 12B:
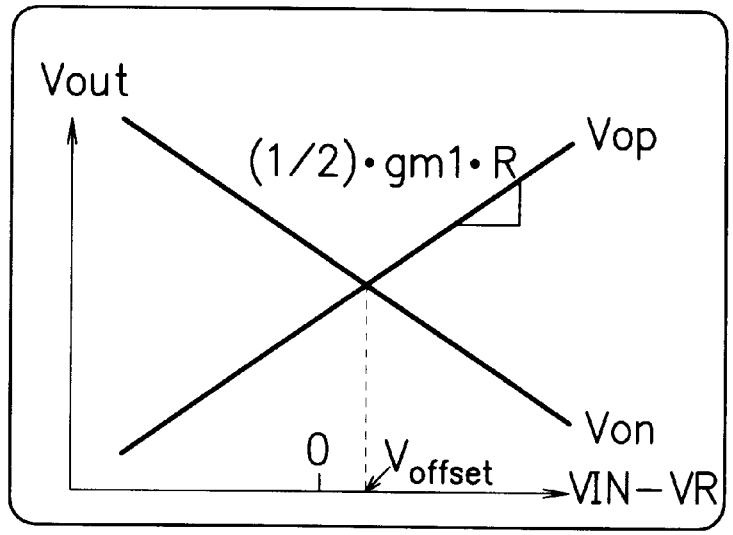
FIG. 12B is the input/output voltage characteristic after the correction.

The individual differential outputs $V_{op}$ and $V_{on}$ can be expressed by using the currents of the equations (19)–(22) above. Further, substituting the equations (11) and (12) yields the following equations (23) and (24). FIGS. 12A and 12B show examples of the input/output voltage characteristics.

$$V_{on} = -(Id1+Id3)*R = -\frac{gm1 \cdot VIN + gm1 \cdot gm2 \cdot R \cdot (VIN - VR_{n+1})}{\frac{1}{R}+gm2} \quad (23)$$

$$V_{op} = -(Id2+Id4)*R = -\frac{gm1 \cdot (VR_{n+1}+V_{off1}) + gm2 \cdot V_{off2}}{\frac{1}{R}+gm2} \quad (24)$$

From the equations (22) and (23), a differential output voltage $\Delta V_{out}=V_{op}-V_{on}$ is given by the following equation (25). Here, $\Delta V_{in}=VIN-VR_{n+1}$.

$$\Delta V_{out} = gm1 \cdot R \cdot \Delta V_{in} - \frac{gm1 \cdot V_{off1}}{\frac{1}{R}+gm2} - \frac{gm2 \cdot V_{off2}}{\frac{1}{R}+gm2} \quad (25)$$

In the equation (25), the first term shows that the differential input voltage appears constant-fold in the differential output voltage. That is, gm1×R is the gain of this differential amplifier. The second and third terms are offset terms appearing on the output. An input offset voltage $V_{offsett}$ as seen from the input of the differential pair 811, is determined by dividing the second and third terms by the gain (gm1×R), or from the following equation (26):

$$V_{offset} = \frac{1}{1+gm2 \cdot R}V_{off1} + \frac{\frac{gm2}{gm1}}{1+gm2 \cdot R}V_{off2} \quad (26)$$

This equation (26) is equivalent to the above-described equation (1), and is shown in FIG. 12B.

FIG. 6 shows a situation where the differential amplifier 31 is in a correcting operation and the differential amplifiers 24–30 are in an amplifying operation. Here, the differential voltages between the analog input voltage VIN and the individual reference voltages VRL, $VR_1$, $VR_2$, $VR_3$, $VR_4$, $VR_5$, and VRH are amplified by the differential amplifiers 24, 25, 26, 27, 28, 29, and 30, respectively. The differential amplifier 31 receives VRH at both inputs of the differential pair, performing the correcting operation. Switches on the output sides of the differential amplifiers are controlled so that the outputs of the differential amplifiers 24–30 are sampled/held by the S/H circuits 32–38, respectively. The outputs of the differential amplifier 31 are switched away from the S/H circuit row 3.

After a certain period of time, the differential amplifier 31 completes its correcting operation. Then, the switches on the output side of the differential amplifiers are controlled when the S/H circuit row 3 is in a hold mode, so that the differential amplifier 31 is connected to the S/H circuit 38 and the outputs of the differential amplifier 30 are separated from the S/H circuit row 3. At the same time, a reference voltage to be input to the differential amplifier 30 is changed from VRH to $VR_5$. This supplies $VR_5$ to both inputs of the differential pair so that the differential amplifier 30 starts its correcting operation. The differential amplifier 31 returns to an amplifying operation mode, amplifying the differential voltage between the analog input voltage VIN and the reference voltage VRH. After another certain period of time, the differential amplifier 29 in turn enters a correcting operation.

Correcting operations are performed, successively in descending order across the differential amplifier row. Upon completion of the correcting operation at the bottom, the correcting operations simply turn around to be successively performed in ascending order this time. On completion at the top end, the correcting operations turn around again to be successively performed in descending order. In this way, the operations are consecutively repeated in a relay fashion. This aims to reduce the number of switches to be operated for switching the inputs/outputs of the differential amplifiers.

Figure 7B:
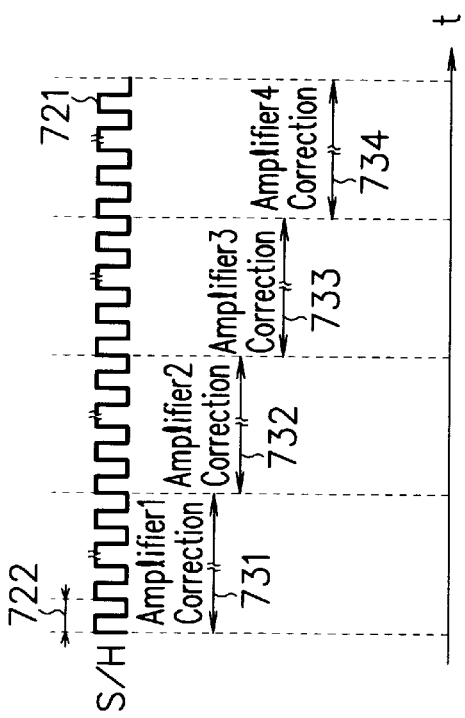
FIG. 7B is a timing chart showing the operations of the differential amplifier row.
Figure 7A:
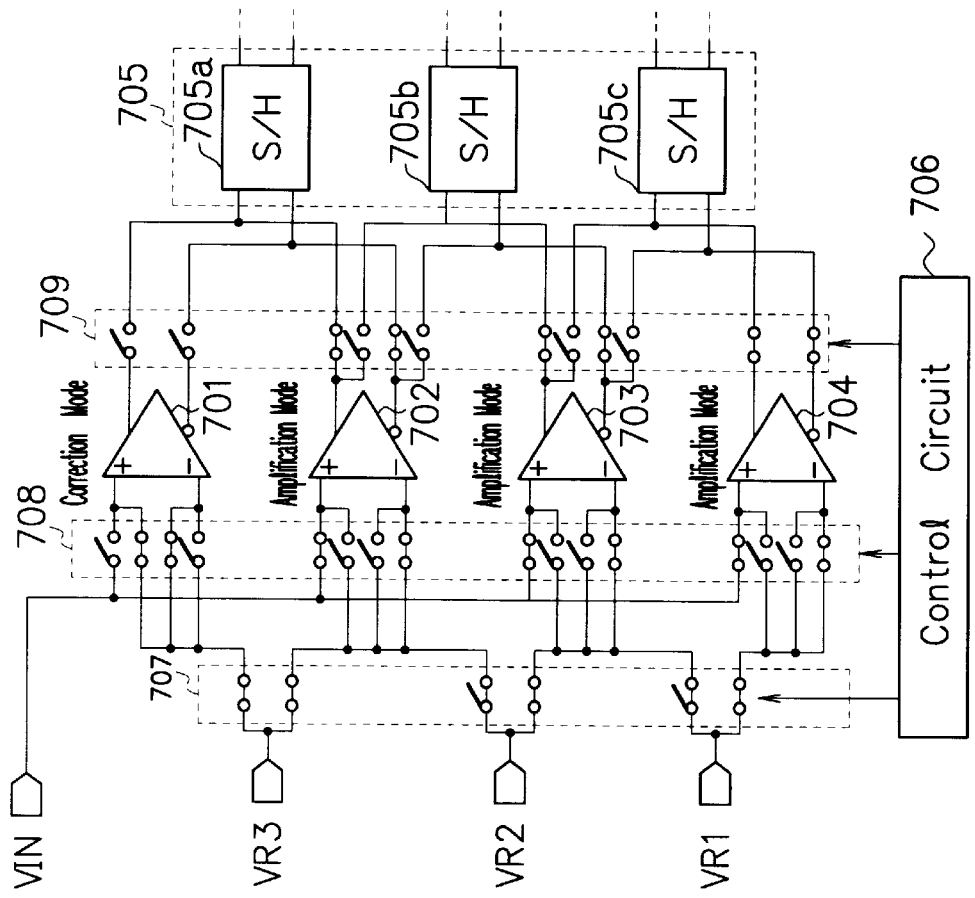
FIG. 7A is a circuit diagram of a differential amplifier row according to the second embodiment.

FIG. 7A shows a simplified partial circuit of the A/D converter in FIG. 6. Aside from the analog input voltage VIN, reference voltages VR1, VR2, and VR3 are generated. The reference voltage VR1, VR2, and VR3 each are input to one of differential amplifiers 701–704 through switches 707 and 708. A control circuit 706 exercises ON/OFF control of the switches 707, 708, and 709.

In FIG. 7A, the differential amplifier 701 is in a correcting operation mode, and the differential amplifiers 702–704 are in an amplifying operation mode. Here, the differential amplifier 701 receives the reference voltage VR3 at both the positive input terminal and negative input terminal thereof. The differential amplifier 702 receives the analog voltage VIN and the reference voltage VR3. The differential amplifier 703 receives the analog voltage VIN and the reference voltage VR2. The differential amplifier 704 receives the analog voltage VIN and the reference voltage VR1.

The differential amplifiers 701–704 output their differential outputs to a S/H circuit row 705 through the switch 709. The S/H circuit row 705 contains S/H circuits 705a, 705b, and 705c. The outputs of the differential amplifier 701 are disconnected from the S/H circuit row 705. The outputs of the differential amplifier 702 are connected to the S/H circuit 705a. The outputs of the differential amplifier 703 are connected to the S/H circuit 705b. The outputs of the differential amplifier 704 are connected to the S/H circuit 705c.

FIG. 7B is a timing chart showing the operations of the A/D converter in FIG. 7A. The sampling clock 721 of the S/H circuit row 705 has a conversion cycle 722. According to this sampling clock 721, the differential amplifiers 701–704 switch between correcting and amplifying operation modes. At a period 731, the differential amplifier 701 enters a correcting operation mode, and the other differential amplifiers 702–704 enter an amplifying operation mode. At a period 732, only the differential amplifier 702 enters a correcting operation mode; at a period 733, only the differential amplifier 703; and at a period 734, only the differential amplifier 704.

In the present embodiment, differential amplifiers with correcting/amplifying operation modes are configured as shown in FIG. 8A. Besides, at least one extra differential amplifier having this configuration is added to the minimum number of differential amplifiers required in the first stage A/D conversion, so that at any point of time the added differential amplifier(s) is/are operated in a correcting operation mode while the other differential amplifiers are in an amplifying operation mode. Upon completion of a correcting operation mode, adjoining differential amplifiers are switched into a correcting operation mode in a temporally continuous manner, whereby the differential amplifiers repeat amplification→correction→amplification→ . . . in a relay fashion. The series of operations is controlled by the control circuit.

Configuring the differential amplifiers as shown in FIG. 8A allows the correction of input offset voltages. In the configuration of FIG. 8A, the capacitance elements for holding correction voltages are connected to the differential pair 813. Since these capacitance elements are not directly visible from the analog input terminal, the capacitances can be increased in order to reduce leakage of charge. Moreover, in the configuration of FIG. 8A, the input capacitance seen from the analog input terminal is a gate capacitance of the differential pair 811, and is extremely smaller, depending on the transistor size of the differential pair.

The differential amplifiers having the configuration of FIG. 8A make their amplifying operations and correcting operations independently. Differential amplifiers in a correcting operation are thus incapable of functioning as part of the A/D converter. Then, as shown in FIG. 7A, α extra differential amplifiers (α≧1) with respect to the number of reference voltage levels are added to constitute the differential amplifier row, and the α differential amplifiers 701 in a correcting operation mode are temporarily separated from the A/D converter. After a certain correcting-operation time, another α differential amplifiers are isolated from the A/D converter into a correcting operation mode. This method eliminates the need for suspending the A/D conversion operation for the sake of correcting operations (that is, no deterioration in conversion speed). It also allows sufficient correction time to be secured irrespective of the sampling cycle (conversion cycle) as shown in FIG. 7B.

Furthermore, the A/D converter described in the present embodiment is configured so that the S/H circuit row 3 comes immediately after the differential amplifier row 2 on the input front end. Therefore, amplifying and correcting operations can be switched at the time of holding of the S/H circuit row 3, thereby precluding switching noise occurring on the switching.

(Third Embodiment)

Figure 14B:
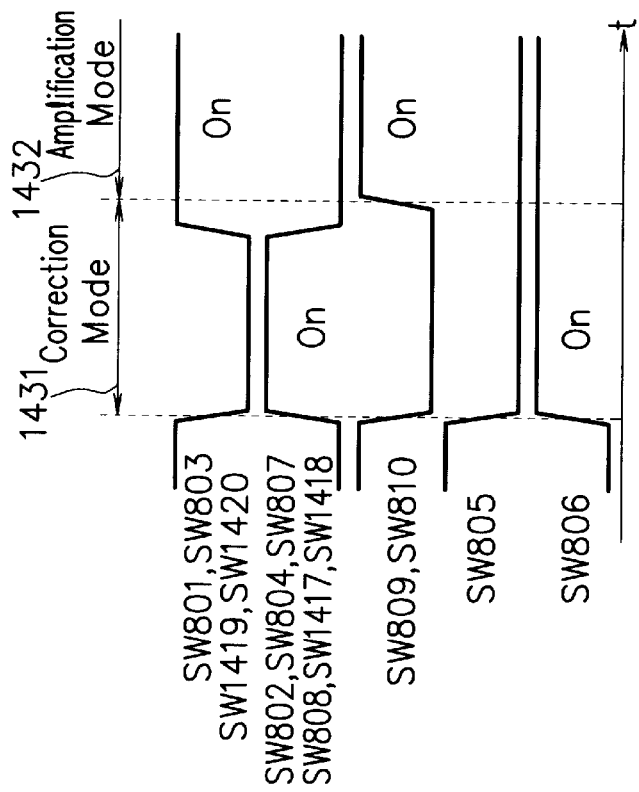
FIG. 14B is a timing chart showing the operations of the differential amplifier.

FIG. 14 shows a differential amplifier according to a third embodiment of the present invention. Switches 801–810 make the same operations as in the second embodiment. Hereinafter, description will be given of the operations of an output resistance circuit (load circuit) 1425 under correcting and amplifying operations in sequence.

Initially, in a correcting operation, switches 1419 and 1420 are turned off, and switches 1417 and 1418 are turned on. This conducts all the p-channel MOS transistors 1421–1424 in the output resistance circuit 1425, so that the transistors 1422 and 1423 form positive feedback. The output resistance $R_{oint}$ in a correcting operation is given by the following equation (27):

$$R_{oint} = \frac{1}{g_{m4}} \cdot \frac{1}{1 - \frac{g_{m3}}{g_{m4}}} \qquad (27)$$

Here, gm3 is the transconductance between the transistors 1421 and 1424, and gm4 is the transconductance between the transistors 1422 and 1423.

Next, in an amplifying operation, the switches 1417 and 1418 are turned off, and the switches 1419 and 1420 are turned on. This disconnects the drain terminals of the transistors 1422 and 1423 from the differential output terminals. The gate terminals and source terminals of the same are shorted to nullify the gate-to-source voltages for a nonconducting state. Here, the output resistance circuit comes to have the configuration as that of FIG. 8A. The output resistance $R_{oamp}$ in an amplifying operation is given by the following equation (28):

$$R_{oamp} = \frac{1}{g_{m4}} \quad (28)$$

Now, the transconductance gm3 is given by the following equation (29), where W is the channel width of the transistors, L the channel length, and Id the drain current:

$$g_m = \sqrt{2\beta\left(\frac{W}{L}\right)I_d} \quad (29)$$

Suppose, for example, that the transistors 1421 and 1423 have W3, L3, and Id3, and the transistors 1422 and 1423 have W4, L4, and Id4. Designing under (W3/W4)=4/5 and L3=L4, the current mirror formed by the transistors 1421 and 1423 (also the transistors 1422 and 1424) makes (Id3/Id4)=4/5. Thus, the equation (29) yields (gm3/gm4)= 4/5. From the equation (27), it is shown that the output resistance $R_{oint}$ in a correcting operation is five times as much as the output resistance $R_{oamp}$ in an amplifying operation. R in the equation (1) is the output resistance $R_{oint}$ in a correcting operation. Since $R_{oint}=5\times R_{oamp}$, the input offset voltage can be reduced approximately five times as much as in the configuration of FIG. 8A.

From the foregoing, it can be seen that even when the direct-current gains are lowered for the sake of linear amplification during amplifying operations, the direct-current gains in correcting operations can be raised temporarily to achieve a sufficient reduction in input offset voltage.

Next, description will be given in detail of the differential amplifier that increases the above-mentioned output resistance temporarily. The basic operation of correction is the same as described in the second embodiment above. A difference lies in the resistances of the output resistance circuit in correction and amplification; therefore, the following description will be given with emphasis on this point.

Given that the output resistance in a correcting operation is Ra, the equations (11) and (12), or the input voltages $V_A$ and $V_B$ of the differential pair 813 in the correcting operation, translate into the following equations (30) and (31):

$$V_A = -\frac{gm1 \cdot Ra \cdot VR_{n+1}}{1 + gm2 \cdot Ra} \quad (30)$$

$$V_B = -\frac{gm1 \cdot Ra \cdot (VR_{n+1} + V_{off1}) + gm2 \cdot Ra \cdot V_{off2}}{1 + gm2 \cdot Ra} \quad (31)$$

Assuming that the output resistance changes to Rb (usually, Ra>Rb) in an amplifying operation, the equations (23) and (24), or the individual output voltages $V_{on}$ and $V_{op}$, yield the following equations (32) and (33):

$$V_{on} = -(Id1 + Id3) * Rb = \\ -\frac{gm1 \cdot Rb \cdot VIN + gm1 \cdot gm2 \cdot Ra \cdot Rb \cdot (VIN - VR_{n+1})}{1 + gm2 \cdot Ra} \quad (32)$$

$$V_{op} = \\ -(Id2 + Id4) * Rb = -\frac{gm1 \cdot Rb \cdot (VR_{n+1} + V_{off1}) + gm2 \cdot Rb \cdot V_{off2}}{1 + gm2 \cdot Ra} \quad (33)$$

From the equations (32) and (33), a differential output voltage $\Delta V_{out}$ is given by the following equation (34):

$$\Delta V_{out} = gm1 \cdot Rb \cdot \Delta V_{in} - \frac{gm1 \cdot Rb \cdot V_{off1}}{1 + gm2 \cdot Ra} - \frac{gm2 \cdot Rb \cdot V_{off2}}{1 + gm2 \cdot Ra} \quad (34)$$

Thus, the input offset voltage in an amplifying operation is obtained by dividing the offset terms in the equation (34) by the gain gm1×R in an amplifying operation, or as in the following equation (35):

$$V_{offset} = \frac{1}{1 + gm2 \cdot Ra}V_{off1} + \frac{\frac{gm2}{gm1}}{1 + gm2 \cdot Ra}V_{off2} \quad (35)$$

When compared to the equation (26), the input offset voltage becomes smaller in value because R<Ra.

In summary, it can be seen from the equations (26) and (35) that greater output resistances Ra in a correcting operation lower the input offset voltage after offset correction. The reason for this is that the greater the output resistance in a correcting operation is, the closer to the equation (14) the difference between the voltages held in the capacitances 815 and 816 after the correcting operation becomes. It is also shown that the output resistance can be changed between in correction and in amplification without affecting correcting operations, for the output resistance in amplification never appears as a parameter in the expression of the corrected input offset voltage.

According to the third embodiment of the present invention, differential amplifiers are configured so that their output resistance circuits can increase in output resistance only when in the correcting operation mode. This increase in output resistance provides the additional function of temporarily raising the direct-current gain in the correcting operation mode above in the amplifying operation mode.

The higher the direct-current gains of the differential amplifiers, the higher the offset correcting effects. An excessive increase in direct-current gain for the sake of higher offset correcting effects, however, causes a problem during amplifying operations. That is, higher gains can saturate output voltages under smaller differences in input voltage, subsequently failing to maintain the linearity of the output voltages with respect to the same range of input voltages. The input/output nonlinearity of the differential amplifiers on the input front end can cause a deterioration in conversion accuracy.

Figure 14A:
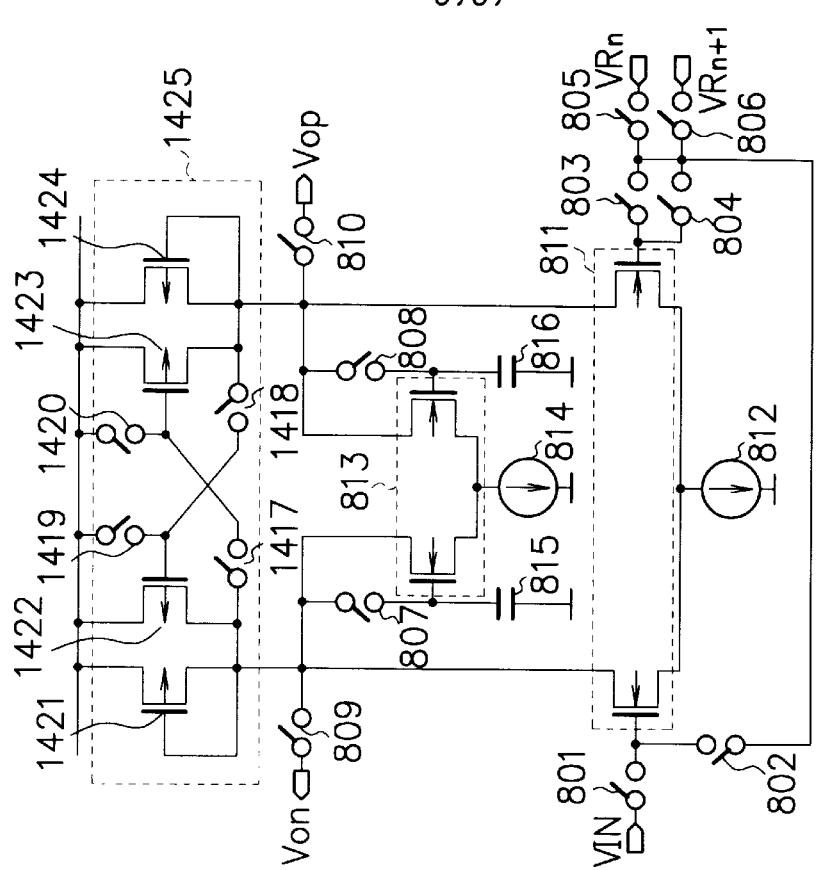
FIG. 14A is a circuit diagram of a differential amplifier according to a third embodiment.

Then, the configuration as in FIG. 14A makes it possible to raise the output resistances only in correcting operations. In proportion to the output resistances, the differential amplifiers increase in direct-current gain. That is, the configuration of FIG. 14A temporarily increases the direct-current gains of the differential amplifiers only in correcting operations. As a result of the foregoing, it becomes possible to realize differential amplifiers which increase in direct-current gains during correcting operations to enhance the offset correcting effects sufficiently, as well as decrease in direct-current gains during amplifying operations to exercise linear amplification.

(Fourth Embodiment)

FIG. 15 shows S/H circuits according to a fourth embodiment of the present invention. A S/H circuit 1540 is in a sample mode, and a S/H circuit 1550 is in a hold mode. The input terminals 1501p and 1501n are input terminals of the S/H circuit row 4 in FIG. 6. The S/H circuit 1540 corresponds to a S/H circuit SHA, and the S/H circuit 1550a S/H circuit SHB.

With the S/H circuit 1540 in a sample mode, switches 1531p and 1531n in a switch 1530 are opened to break the connection between the S/H circuit 1540 and output terminals 1534p and 1534n. Wiring capacitances 1533p, 1533n lie between the output terminals 1534p, 1534n and a ground, respectively.

With the S/H circuit 1550 in a hold mode, switches 1532p and 1532n in a switch 1530 are closed to establish the connection between the S/H circuit 1550 and output terminals 1536p and 1536n. Wiring capacitances 1535p, 1535n lie between the output terminals 1536p, 1536n and a ground, respectively.

Next, description will be given of the configuration of the S/H circuit 1540. The input terminal 1501p is connected to an input terminal inp of a differential amplifier 1510 through a switch 1511p and a capacitor 1512p. The input terminal 1501n is connected to an input terminal inn of the differential amplifier 1510 through a switch 1511n and a capacitor 1512n. An output terminal outn of the differential amplifier 1510 is connected through a switch 1514p to the input terminal inp, and through a switch 1513p to the interconnection node between the switch 1511p and the capacitor 1512p. An output terminal outp of the differential amplifier 1510 is connected through a switch 1514n to the input terminal inn, and through a switch 1513n to the interconnection node between the switch 1511n and the capacitor 1512n. A control signal from the encoder 6 or the like (FIG. 6) is input to the control terminal ctrl of the differential amplifier through a terminal 1516.

The S/H circuit 1550 is identical to the S/H circuit 1540 described above, with a differential amplifier 1520 in place of the differential amplifier 1510. Since the S/H circuit 1540 is in a sample mode, the switches 1511p, 1511n, 1514p, and 1514n are closed and the switches 1513p and 1513n are opened. In contrast, the S/H circuit 1550 is in a hold mode, having the switches 1511p, 1511n, 1514p, and 1514n opened and the switches 1513p and 1513n closed.

Figure 16A:
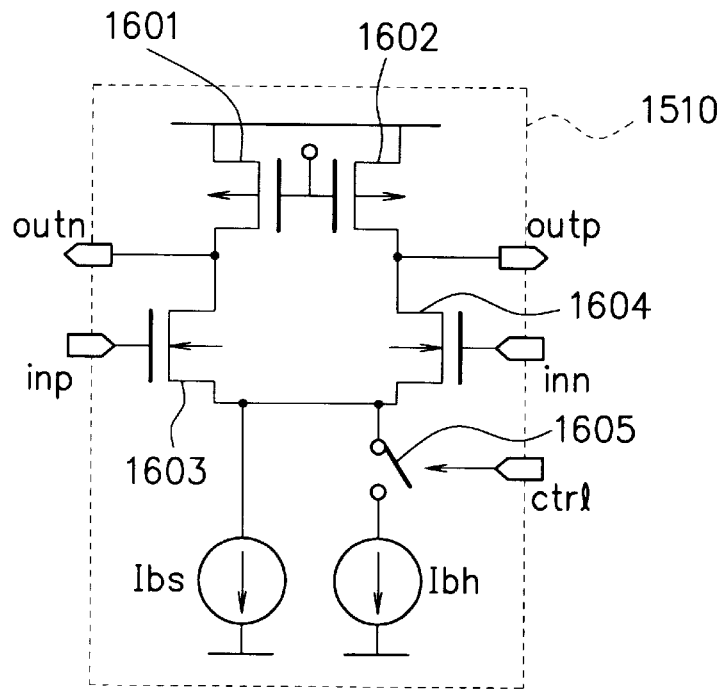
FIG. 16A is a circuit diagram of a differential amplifier in the S/H circuit in a sample mode.
Figure 16B:
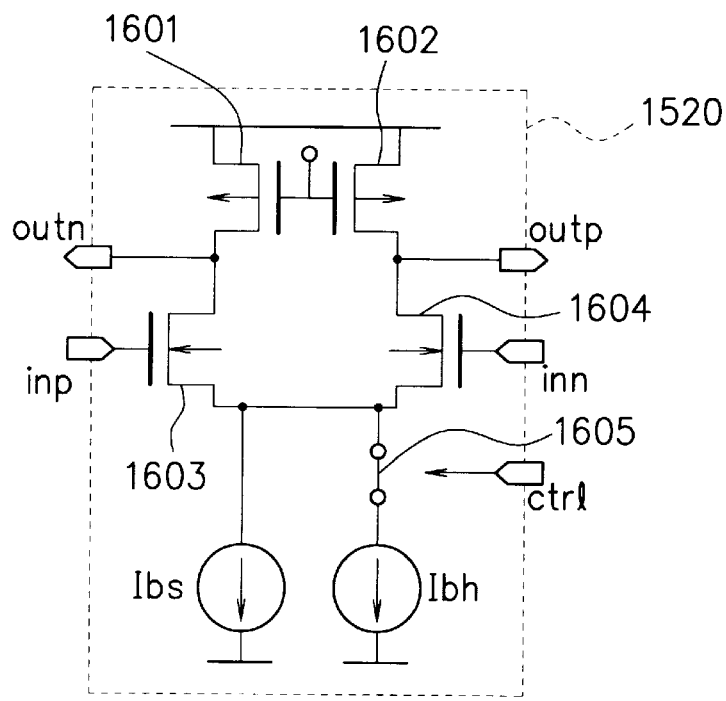
FIG. 16B is a circuit diagram of the differential amplifier in the S/H circuit in a hold mode.

FIG. 16A is a circuit diagram of the differential amplifier 1510. FIG. 16B is a circuit diagram of the differential amplifier 1520. The differential amplifiers 1510 and 1520 each have a current source Ibs for supplying a constant current to the coupled source terminals of the input differential pair, coupled with a single current source Ibh having a switch 1605 capable of switching on/off a current path thereof.

Now, the configuration of the differential amplifiers 1510 and 1520 will be described in detail. A p-channel MOS transistor 1601 is connected at its source to a power supply voltage, and at its drain to the output terminal outn. A p-channel MOS transistor 1602 is connected at its source to the power supply voltage, and at its drain to the output terminal outp. The gates of the transistors 1601 and 1602 are both connected to a predetermined voltage terminal. An n-channel MOS transistor 1603 is connected at its drain to the output terminal outn, and at its gate to the input terminal inp. An n-channel MOS transistor 1604 is connected at its drain to the output terminal outp, and at its gate to the input terminal inn. The sources of the transistors 1603 and 1604 are connected to each other.

The constant current source Ibs is connected at one end to the interconnection node between the sources of the transistors 1603 and 1604, and is grounded at the other end. The constant current source Ibh is connected at one end to the interconnection node between the sources of the transistors 1603 and 1604 through the switch 1605, and is grounded at the other end. The switch 1605 is controlled by the control signal from the encoder 6 or the like (FIG. 6) so as to switch on/off the current path.

Figure 16C:
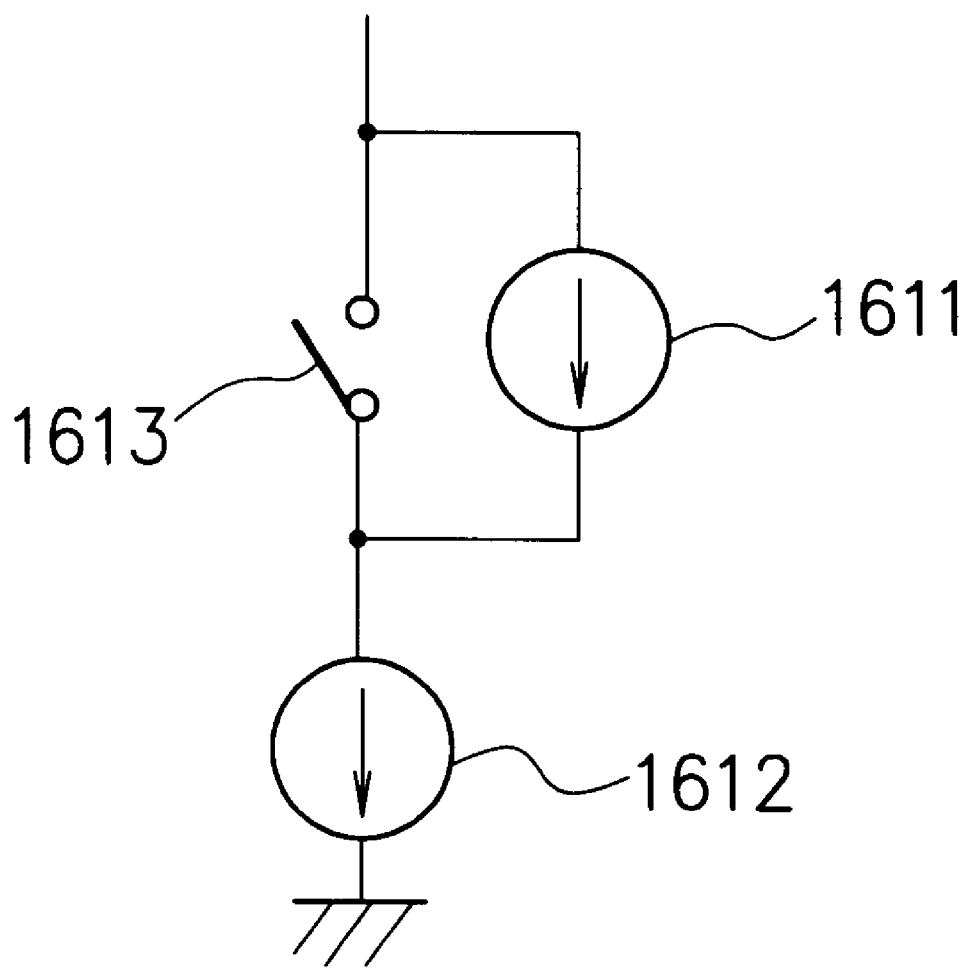
FIG. 16C is another configuration example of two current sources for supplying currents of two values.
Figure 18:
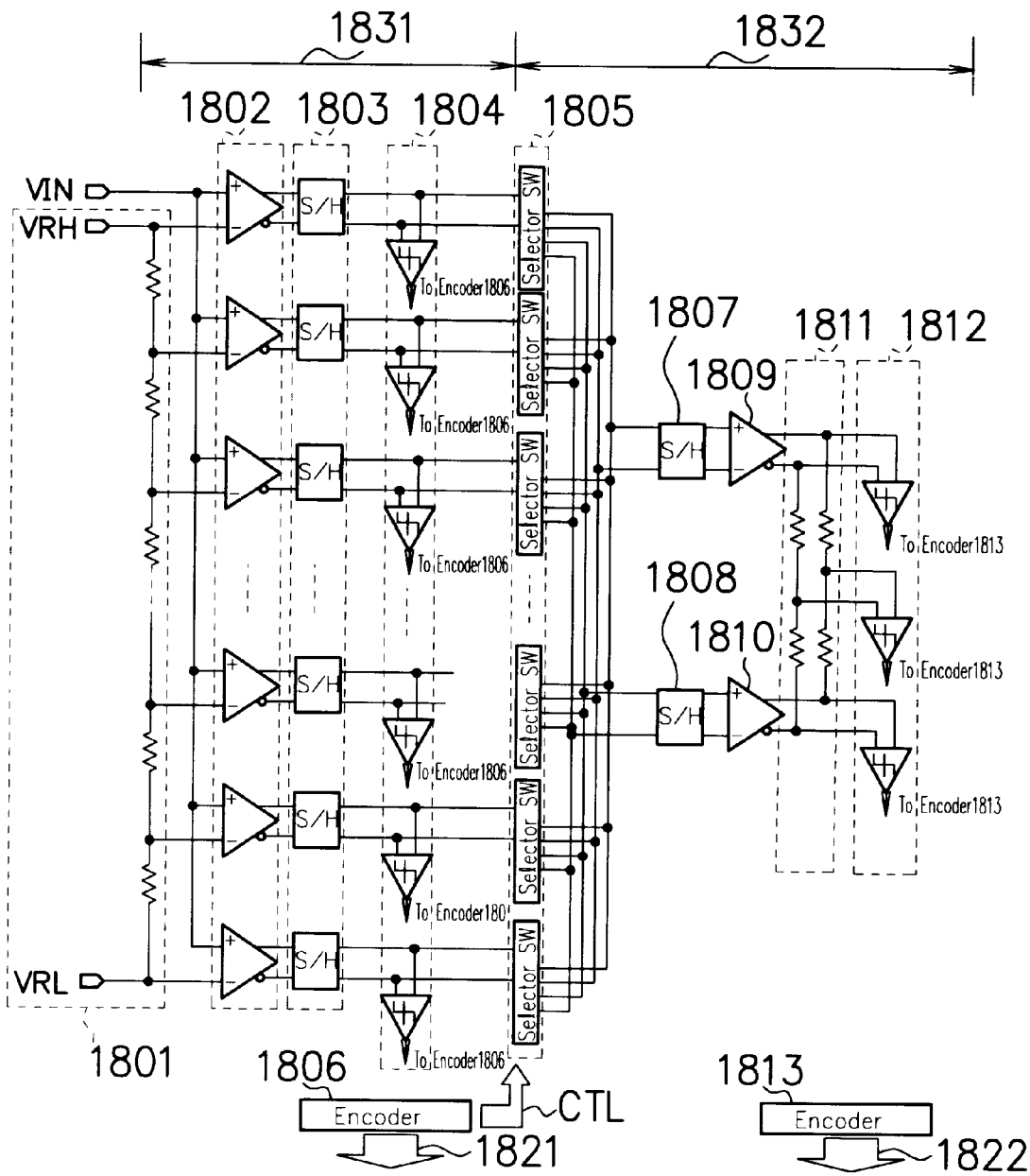
FIG. 18 is a circuit diagram of an A/D converter according to the conventional art.

FIG. 16C is another configuration example of two current sources for supplying currents of two values. The current sources 1611, 1612 and the switch 1613 are used in FIG. 16C, while the current sources Ibs and Ibh are used in FIGS. 16A and 16B. The current sources 1611 and 1612 are connected to each other in series. The switch 1613 is connected to the current source 1611 in parallel. Suppose, for instance, the current source 1611 can supply current of a value 5 and the current source 1612 can supply current of a value 10. By turning on the switch 1613 so as to make the serial connection of the switch 1613 and the current source 1612 a current path, current of a value 10 can be supplied. By turning off the switch 1613 so as to make the serial connection of the current sources 1611 and 1612 a current path, current of a value 5 can be supplied. Thus, by turning on/off the switch 1613, current with two values can be supplied. Next, configuration examples in which the current sources Ibs and Ibh are used as being shown in FIGS. 16A and 16B will be described.

In FIG. 15, the capacitances 1533p, 1533n, 1535p, and 1535n are the input capacitances of the respective terminals in the next stage. FIG. 15 shows a situation where the switches 1532p and 1532n in the selector switch 1530 transfer data of the S/H circuit 1520 to the next stage. Here, the switch 1605 for supplying the current source Ibh in the differential amplifier 1520 is turned on to provide a bias current of Ibs+Ibh.

FIG. 17 shows time variations of the bias currents in the differential amplifier 1510 of the S/H circuit 1540 and the differential amplifier 1520 of the S/H circuit 1550. In FIG. 17, the bias current of the S/H circuit 1540 is shown to the top, and the bias current of the S/H circuit 1550 to the bottom. At a period 1701, the S/H circuit 1540 enters a sample mode and the S/H circuit 1550 a hold mode. Next, at a period 1702, the S/H circuit 1540 enters a hold mode and the S/H circuit 1550 a sample mode. Subsequently, the periods 1701 and 1702 are repeated alternately. The S/H circuits 1540 and 1550 have a bias current 1722 of Ibs in a sample mode, and a bias current 1721 of Ibs+Ibh in a hold mode.

As shown in FIG. 17, the bias current in a hold mode can take two values 1721 and 1722.

The bias current 1721 is for situations where the S/H circuit is in a hold mode and transfers data to the next stage. Here, the switch 1605 turns on for a bias current value of Ibs+Ibh. On the other hand, the bias current 1722 is for situations where no data is transferred to the next stage. Since the switch 1605 does not turn on, the current has the same value Ibs as in a sample mode.

Suppose that the number of S/H circuits contained in a S/H circuit row is 2N. Then, in a given sampling cycle (conversion cycle), N of the circuits are in a sample mode and the remaining N are in a hold mode. Moreover, among the N S/H circuits in the hold mode, four transfer data to the next stage during one sampling cycle. The remaining (N−4) circuits simply make holding operations. Then, if the four circuits are exclusively brought into the state of the bias current 1721 and the remainder are controlled to the state of the bias current 1722, the S/H circuit row has a time-averaged total current consumption $I_{tot1}$ given by the following equation (36):

$$I_{tot1}=4 \cdot (I_{bs}+I_{bh})+(2N-4) \cdot I_{bs}[A] \tag{36}$$

On the other hand, if all the S/H circuits in the hold mode are set to the bias current 1721 of FIG. 17, the S/H circuit row has a time-averaged total current consumption $I_{tot2}$ given by the following equation (37):

$$I_{tot2}=N \cdot (I_{bs}+I_{bh})+N \cdot I_{bs}[A] \tag{37}$$

Moreover, in the cases where the differential amplifiers contain a single current source Ibs+Ibh instead of having a switch-and-current-sources configuration as shown in FIGS. 16A and 16B, the time-averaged total current consumption $I_{tot3}$ is given by the following equation (38):

$$I_{tot3}=2N \cdot (I_{bs}+I_{bh})[A] \tag{38}$$

The equations (36)–(38) show that $I_{tot1}<I_{tot2}<I_{tot3}$. As is clear from the equation (36), the present embodiment can suppress the current consumption to a minimum, achieving a reduction in power consumption.

According to the fourth embodiment of the present invention, two S/H circuits are inserted in parallel into the front of each selector switch in the individual A/D conversion blocks. In each of the S/H circuits, at least one current source having a switch for switching the current path on/off is connected to the coupled source terminals of an input differential pair in the differential amplifier constituting the S/H circuit, in parallel with a constant current source. In a S/H circuit row, only four S/H circuits that hold the four given differential voltages or interpolation voltages to be transferred to the next stage receive selector switch control signals generated by the encoder, turning on the switches in the differential amplifiers thereof. Thereby, the differential amplifiers operate so as to temporarily increase in bias current only while transferring data to the next stage.

The S/H circuits in front of the selector switches in each A/D conversion block are supposed to charge/discharge large load capacitances (mainly wiring capacitances) when connected to the next stage through the selector switches in a hold mode. Therefore, to ensure the operating speed of the S/H circuits, the differential amplifiers constituting the S/H circuits must be adjustable in bias current to values that ensure holding operations. In a sample mode, however, the load capacitances mentioned above are disconnected from the S/H circuits. The bias current values adjusted to ensure holding operations are therefore overspecified to sampling operations. Then, the differential amplifiers in the S/H circuits are configured as in FIGS. 16A and 16B, so that the switches turn on to increase the bias current values at the time of holding alone. This can suppress the power consumption of the individual S/H circuits themselves while ensuring the speed of the holding operations.

Meanwhile, the number of S/H circuits in a S/H circuit row which are connected to the next stage through selector switches is only four all the time. Therefore, the differential amplifiers of the four circuits can be selectively and exclusively increased in bias current value to make a further reduction in the power consumption of the S/H circuit block.

As has been described, according to the first through fourth embodiment, it is possible to achieve an A/D converter that meets all the requirements for higher speed, higher resolution, and lower power consumption.

Note that the above-described embodiments have shown just a few examples of embodiment in practicing the present invention, and should not be considered as restrictive of the technical scope of the present invention. That is, the present invention may be practiced in various forms without departing from the technical philosophy and principle features thereof.

As has been described, the second sample/hold circuit row includes the second and third sample/hold circuits connected in parallel to each output of the first sample/hold circuit row. When the second sample/hold circuits are in a sample mode, the third sample/hold circuits are brought into a hold mode. In this way, the sample/hold circuits to perform sampling are alternated at conversion cycles. The alternation of the sample/hold circuits for sampling allows an increase in A/D conversion speed. Moreover, since stable hold time can be secured, it is possible to realize an A/D converter of higher accuracy.

What is claimed is:

1. An A/D converter comprising:
    a reference voltage generating circuit for generating a plurality of reference voltages;
    a differential amplifier row including a plurality of differential amplifiers for receiving an analog input voltage and said reference voltages, amplifying differential voltages between said analog input voltage and said reference voltages and outputting the resultant;
    a first sample/hold circuit row including a plurality of first sample/hold circuits for sampling/holding said amplified differential voltages;
    a second sample/hold circuit row for performing interleaving operations, having a pair of second and third sample/hold circuits connected to said first sample/hold circuits;
    a first selector row including a plurality of selectors for selecting the output of said second sample/hold circuits and said third sample/hold circuits;
    a first comparator row including a plurality of comparators for determining a polarity of said amplified differential voltages; and
    a first encoder for outputting digital code corresponding to the output of said first comparator row.

2. The A/D converter according to claim 1, wherein said first encoder, while outputting digital code corresponding to the outputs of said first comparator row, detects from the outputs of said first comparator row a boundary across which said individual differential voltages between said analog input voltage and said respective reference voltages are inverted in sign, and generates a control signal for controlling a first selector switch row for transferring four pairs of differential voltages to an A/D conversion block in the next stage, said four pairs of differential voltages are taken out of said individual differential voltages held by said second sample/hold circuit row, and are lying in the vicinity of said boundary detected to an A/D conversion block in the next stage.

3. The A/D converter according to claim 2, wherein said first selector switch row is controlled by said control signal generated by said first encoder, to transfer said given four pairs of differential voltages from said second sample/hold circuit row.

4. The A/D converter according to claim 3, wherein said A/D conversion block in the next stage comprises:
    first, second, third, and fourth differential amplifiers for amplifying four pairs of differential voltages transferred from said first selector switch row, and outputting the resultant to between noninverted output terminals and inverted output terminals as potential differences;

an interpolation circuit for dividing the outputs of said noninverted output terminals and inverted output terminals of said first and second differential amplifiers, said noninverted output terminals and inverted output terminals of said second and third differential amplifiers, and said noninverted output terminals and inverted output terminals of said third and fourth differential amplifiers with impedance element rows, respectively, to generate a plurality of differential interpolated voltages;

a second comparator row including a plurality of comparators for determining whether.said individual differential interpolated voltages generated by said interpolation circuit are positive or negative; and a second encoder for outputting digital code corresponding to the outputs of said second comparator row.

5. The A/D converter according to claim 4, further comprising a third sample/hold circuit row having two sample/hold circuits connected in parallel to each of said differential interpolated voltages generated by said interpolation circuit, either of said sample/hold circuits being brought into a sample mode while the other sample/hold circuit is in a hold mode so that each of said individual differential interpolation voltages generated by said interpolation circuit is sampled alternately at conversion cycles, and wherein said second encoder, while outputting digital code corresponding to the outputs of said second comparator row, detects from the outputs of said second comparator row a boundary across which said individual differential interpolation voltages are inverted in sign, and generates a control signal for controlling a second selector switch row for transferring given four differential interpolation voltages out of said individual differential interpolation voltages held by said third sample/hold circuit row, lying in the vicinity of said boundary detected to an A/D conversion block in the still next stage.

6. The A/D converter according to claim 1, wherein each of said differential amplifiers in said differential amplifier row comprises:

a control circuit for switching between an amplifying operation mode and an offset correcting operation mode;

a first differential pair transistor for functioning as an input unit in said amplifying operation mode;

a second differential pair transistor sharing individual drain terminals with said first differential pair transistor;

two capacitance elements connected to between the gate terminals of said second differential pair transistor and a reference potential, respectively;

two output resistors connected to the shared drain terminals of said first and second differential pair transistors;

two first switches for shorting differential output terminals and the respective gate terminals of said second differential pair transistor; and second switches for switching input/output depending on.whether an amplifying operation mode or an offset correcting operation mode.

7. The A/D converter according to claim 6, wherein:

said differential amplifier row includes at least one differential amplifier more than the number of reference voltages to be generated by said reference voltage generating circuit; and at any point of time, said differential amplifiers as many as the number of said reference voltages are in an amplifying operation mode and the remainder is/are in an offset correcting operation mode.

8. The A/D converter according to claim 7, wherein said differential amplifiers, in said offset correcting operation mode, turn off said second switches for input/output to perform an offset correcting operation, and, in said amplifying operation mode, turn on said second switches for input/output to perform an amplifying operation.

9. The A/D converter according to claim 8, wherein:

said differential amplifiers, after the completion of said offset correcting operation, are switched from said offset correcting operation mode to said amplifying operation mode when said succeeding first sample/hold circuit row is in a hold mode; and another differential amplifier or other differential amplifiers in said amplifying operation mode is/are switched from said amplifying operation mode to said offset correcting operation mode instead.

10. The A/D converter according to claim 9, wherein said differential amplifier(s) to be switched from said offset correcting operation mode to said amplifying operation mode and said differential amplifier(s) to be switched from said amplifying operation mode to said offset correcting operation mode are adjacent to each other, so that the switching is successively performed across said plurality of differential amplifiers within said differential amplifier row in a relay fashion.

11. The A/D converter according to claim 10, wherein said differential amplifier row is a differential amplifier row on the input front end of the A/D converter.

12. The A/D converter according to claim 6, further comprising a booster for raising the amplification factors of said differential amplifiers in said offset correcting operation mode, and for lowering the amplification factors of said differential amplifiers in said amplifying operation mode.

13. The A/D converter according to claim 11, further comprising a booster for raising the amplification factors of said differential amplifiers in said offset correcting operation mode, and for lowering the amplification factors of said differential amplifiers. in said amplifying operation mode.

14. The A/D converter according to claim 1, wherein:

said second and third sample/hold circuits have differential amplifiers; and said differential amplifiers each comprise a constant current source to be connected to the coupled source terminals of an input differential pair transistor, and one or more switch type current sources to be connected in parallel with said constant current source, having a switch for connecting/disconnecting a current path thereof.

15. The A/D converter according to claim 14, wherein said switch type current sources disconnect their current paths in a sample mode, and connect their current paths in a hold mode.

16. The A/D converter according to claim 2, wherein:

said second and third sample/hold circuits have differential amplifiers; and said differential amplifiers each comprise a constant current source to be connected to the coupled source terminals of an input differential pair transistor, and one or more switch type current sources to be connected in parallel with said constant current source, having a switch for connecting/disconnecting a current path thereof.

17. The A/D converter according to claim 16, wherein said switch type current sources disconnect their current paths in a sample mode, and connect their current paths in a hold mode.

18. The A/D converter according to claim 17, wherein at least four sample/hold circuits in said second/hold circuit row, holding said given four differential voltages to transfer to the next stage connect the current paths of said switch type current sources in their differential amplifiers while said sample/hold circuits holding other differential voltages disconnect the current paths of said switch type current sources in their differential amplifiers.

19. The A/D converter according to claim 1, wherein said second sample/hold circuit row interleaves said second and third sample/hold circuits at cycles twice the sampling cycles of the first sample/hold circuit row.

20. The A/D converter according to claim 13, wherein:
said second and third sample/hold circuits have differential amplifiers; and
said differential amplifiers each comprise a constant current source to be connected to the coupled source terminals of an input differential pair transistor, and
one or more switch type current sources to be connected in parallel with said constant current source, having a switch for connecting/disconnecting a current path thereof.

21. The A/D converter according to claim 20, wherein said switch type current sources disconnect their current paths in a sample mode, and connect their current paths in a hold mode.

22. The A/D converter according to claim 1, wherein said first encoder generates a control signal for controlling said first selector row.

23. A sample/hold circuit comprising:
a reference voltage generating circuit for generating a plurality of reference voltages;
a differential amplifier row including a plurality of differential amplifiers for receiving an analog input voltage and said reference voltages, amplifying differential voltages between said analog input voltage and said reference voltages, and outputting the resultant;
a first sample/hold circuit row including a plurality of first sample/hold circuits for sampling/holding said amplified differential voltages;
a second sample/hold circuit row for performing interleaving operations, having a pair of second and third sample/hold circuits connected to said first sample/hold circuits; and
a first selector row including a plurality of selectors for selecting the output of said second sample/hold circuits and said third sample/hold circuits.

24. The sample/hold circuit according to claim 23, wherein said first selector row is controlled by a control signal which is generated on the basis of a polarity of said amplified differential voltages.

* * * * *